(12) United States Patent
Arizumi et al.

(10) Patent No.: US 10,636,958 B2
(45) Date of Patent: Apr. 28, 2020

(54) ELEMENT AND ELECTRIC GENERATOR

(71) Applicants: Yuko Arizumi, Kanagawa (JP);
Tsuneaki Kondoh, Kanagawa (JP);
Mizuki Otagiri, Kanagawa (JP);
Junichiro Natori, Kanagawa (JP);
Tomoaki Sugawara, Kanagawa (JP);
Takahiro Imai, Tokyo (JP)

(72) Inventors: Yuko Arizumi, Kanagawa (JP);
Tsuneaki Kondoh, Kanagawa (JP);
Mizuki Otagiri, Kanagawa (JP);
Junichiro Natori, Kanagawa (JP);
Tomoaki Sugawara, Kanagawa (JP);
Takahiro Imai, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 477 days.

(21) Appl. No.: 15/545,136

(22) PCT Filed: Jan. 5, 2016

(86) PCT No.: PCT/JP2016/000028
§ 371 (c)(1),
(2) Date: Jul. 20, 2017

(87) PCT Pub. No.: WO2016/117285
PCT Pub. Date: Jul. 28, 2016

(65) Prior Publication Data
US 2018/0013057 A1 Jan. 11, 2018

(30) Foreign Application Priority Data

Jan. 22, 2015 (JP) .................................. 2015-010283
Sep. 25, 2015 (JP) .................................. 2018-188895

(51) Int. Cl.
*H01L 41/113* (2006.01)
*H01L 41/193* (2006.01)
(Continued)

(52) U.S. Cl.
CPC ............ *H01L 41/193* (2013.01); *B32B 5/022* (2013.01); *B32B 5/024* (2013.01); *B32B 5/028* (2013.01);
(Continued)

(58) Field of Classification Search
CPC ..... H01L 41/113; H01L 41/193; B32B 15/02; B32B 15/16; B32B 25/02; B32B 25/10; B32B 5/22; B32B 25/20
See application file for complete search history.

(56) References Cited

U.S. PATENT DOCUMENTS 4,250,415 A 2/1981 Lewiner et al.
4,686,135 A * 8/1987 Obayashi ................ B32B 25/08
442/94

(Continued)

FOREIGN PATENT DOCUMENTS

EP 0 236 222 A1 9/1987
EP 2 164 119 A1 3/2010
(Continued)

OTHER PUBLICATIONS

Korean Office Action dated Mar. 20, 2019 in Patent Application No. 10-2017-7023299 (with English translation), citing documents AO and AP therein, 10 pages.

(Continued)

Primary Examiner — J. San Martin
(74) Attorney, Agent, or Firm — Oblon, McClelland, Maier & Neustadt, L.L.P.

(57) ABSTRACT

An element including: a first electrode; an intermediate layer made of a silicone rubber composition containing a silicone rubber; and a second electrode, where the first electrode, the intermediate layer, and the second electrode are disposed in this order, wherein a peak intensity ratio ($1095\pm5$ cm$^{-1}$/ $1025\pm5$ cm$^{-1}$) of an infrared absorption spectrum of the (Continued)

intermediate layer varies along a vertical direction relative to a surface of the first electrode, and to a surface of the second electrode.

11 Claims, 3 Drawing Sheets

(51) Int. Cl.

| | |
|---|---|
| C08K 3/34 | (2006.01) |
| B32B 5/02 | (2006.01) |
| B32B 15/02 | (2006.01) |
| B32B 15/06 | (2006.01) |
| B32B 25/02 | (2006.01) |
| B32B 25/10 | (2006.01) |
| B32B 25/20 | (2006.01) |
| C08L 83/04 | (2006.01) |
| H01G 7/02 | (2006.01) |
| H01L 41/253 | (2013.01) |
| C08G 77/14 | (2006.01) |
| C08K 3/36 | (2006.01) |
| C08K 5/549 | (2006.01) |
| H02N 1/08 | (2006.01) |

(52) U.S. Cl.
CPC .............. *B32B 15/02* (2013.01); *B32B 15/06* (2013.01); *B32B 25/02* (2013.01); *B32B 25/10* (2013.01); *B32B 25/20* (2013.01); *C08G 77/14* (2013.01); *C08K 3/34* (2013.01); *C08K 3/36* (2013.01); *C08K 5/549* (2013.01); *C08L 83/04* (2013.01); *H01G 7/02* (2013.01); *H01L 41/113* (2013.01); *H01L 41/253* (2013.01); *B32B 2262/106* (2013.01); *B32B 2307/20* (2013.01); *B32B 2307/202* (2013.01); *B32B 2457/00* (2013.01); *B32B 2457/16* (2013.01); *H01G 7/028* (2013.01); *H02N 1/08* (2013.01)

(56) References Cited

U.S. PATENT DOCUMENTS

| | | | |
|---|---|---|---|
| 9,152,109 B2 | 10/2015 | Sugawara et al. | |
| 2007/0184238 A1* | 8/2007 | Hockaday ................. B32B 7/00 | 428/98 |
| 2010/0109486 A1* | 5/2010 | Polyakov ............ H01L 41/0474 | 310/365 |
| 2010/0154747 A1 | 6/2010 | Inagaki et al. | |
| 2010/0323767 A1 | 12/2010 | Tanaka et al. | |
| 2011/0104505 A1* | 5/2011 | Mori ........................ B32B 7/12 | 428/447 |
| 2012/0177907 A1 | 7/2012 | Koike et al. | |
| 2013/0026411 A1 | 1/2013 | Jenninger et al. | |
| 2013/0307371 A1* | 11/2013 | Sakashita .............. H01L 41/113 | 310/300 |
| 2014/0110622 A1 | 4/2014 | Jenninger et al. | |
| 2014/0111063 A1* | 4/2014 | Bae ..................... H01L 41/0477 | 310/339 |
| 2015/0078794 A1 | 3/2015 | Natori et al. | |
| 2015/0248083 A1 | 9/2015 | Kondoh et al. | |
| 2016/0276957 A1* | 9/2016 | Sugawara ............. H02N 2/186 | |
| 2016/0336505 A1* | 11/2016 | Arizumi ................ H01L 41/113 | |
| 2017/0093305 A1* | 3/2017 | Sugawara ............. B63C 9/0005 | |
| 2017/0148973 A1* | 5/2017 | Imai ...................... H01L 41/053 | |
| 2017/0207729 A1* | 7/2017 | Kondoh .................... F03G 5/00 | |
| 2017/0324023 A1* | 11/2017 | Kondoh ................ H01L 41/253 | |
| 2018/0145244 A1* | 5/2018 | Otagiri ................... G01L 5/226 | |

FOREIGN PATENT DOCUMENTS

| | | |
|---|---|---|
| EP | 2 325 948 A1 | 5/2011 |
| JP | 54-014696 | 2/1979 |
| JP | 54-094698 | 7/1979 |
| JP | 60-078742 | 5/1985 |
| JP | 3893841 | 12/2006 |
| JP | 2008-053527 | 3/2008 |
| JP | 2012-164727 | 8/2012 |
| JP | 2012-164917 | 8/2012 |
| JP | 2013-540165 | 10/2013 |
| JP | 2014-027756 | 2/2014 |
| JP | 5512063 | 4/2014 |
| JP | 5563746 | 6/2014 |
| JP | 2014-239647 A | 12/2014 |
| KR | 10-2012-0101047 A | 9/2012 |
| WO | WO01/006579 A2 | 1/2001 |
| WO | WO2011/034186 A1 | 3/2011 |
| WO | WO2014/017184 A1 | 1/2014 |
| WO | WO 2014/105970 A1 | 7/2014 |

OTHER PUBLICATIONS

Examination Report dated May 22, 2019 in Indian Patent Application No. 201737025714 (with English translation) citing document AO therein, 6 pages.

Extended European Search Report dated Jan. 5, 2018 in Patent Application No. 16739897.3, citing references AA and AO-AQ therein, 4 pages.

International Search Report and Written Opinion dated Mar. 22, 2016 for counterpart International Patent Application No. PCT/JP2016/000028 filed Jan. 5, 2016.

M.M.Perlman, K.J.Kao, and S.S.Bamji, Silicone resin electrets, Journal of Applied Physics, vol. 50, Issue 5, American Institute of Physics, May 1, 1979, pp. 3622-3627.

Fukuda. Elichi, the 29$^{th}$ Piezosalon, [retrieved on Nov. 29, 2016], [online], Oct. 2007, Retrieved from the Internet<http://www.kobayashi-riken.or.jp/news/No98/98_4.htm>.

Soga Iwao, et al., Infrared Dichroism and Surface Conformational Dynamics of Adsorbed Poly (dimethylsiloxane), Macromolecules 1998, 31, 5450-5455.

\* cited by examiner

[Fig. 1]
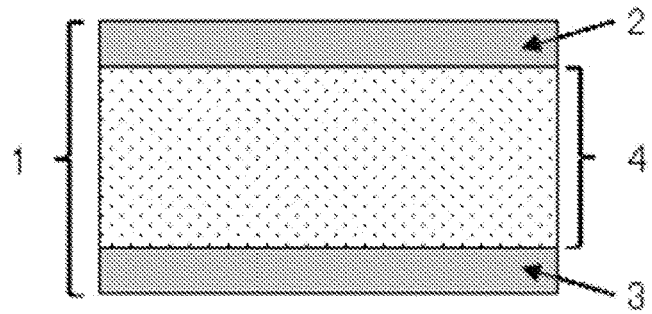
[Fig. 2]
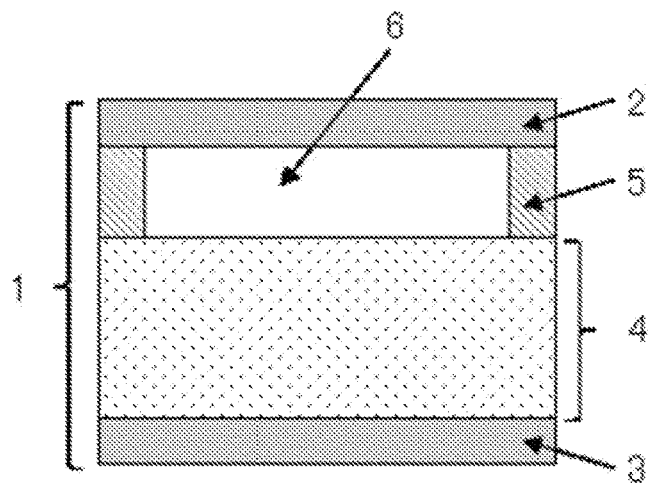
[Fig. 3]
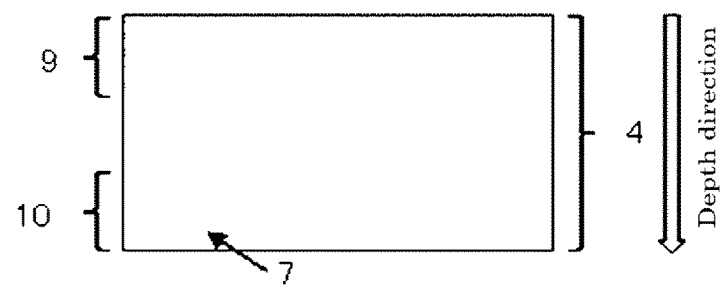
[Fig. 4]
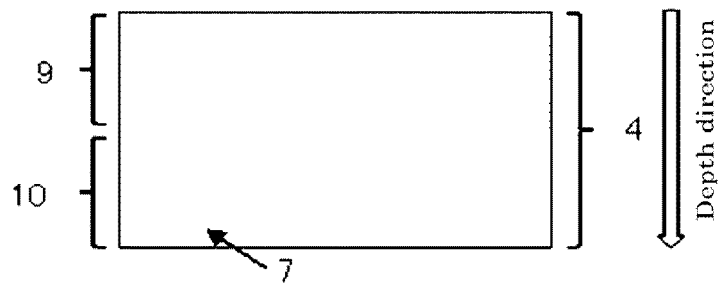

[Fig. 5]
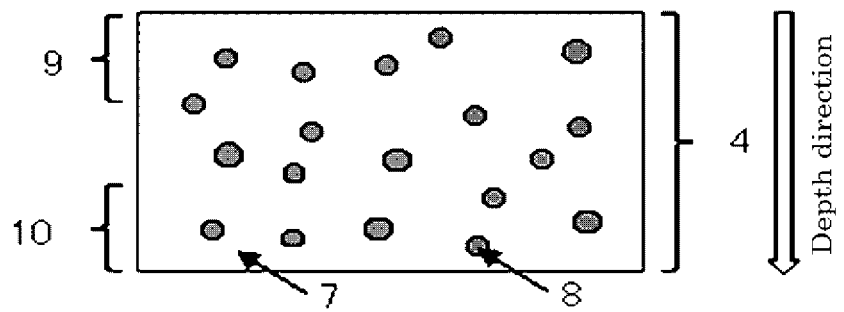
[Fig. 6]
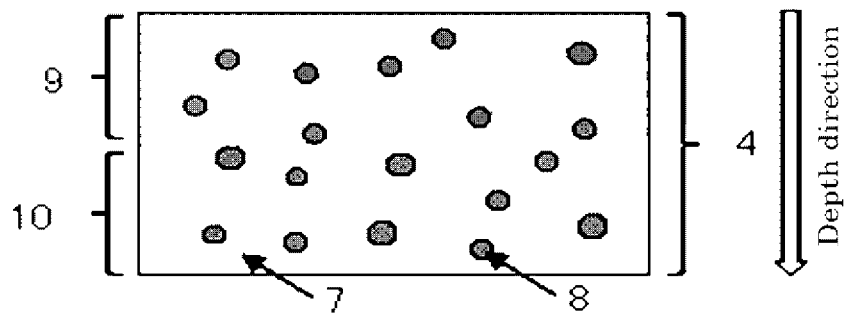
[Fig. 7]
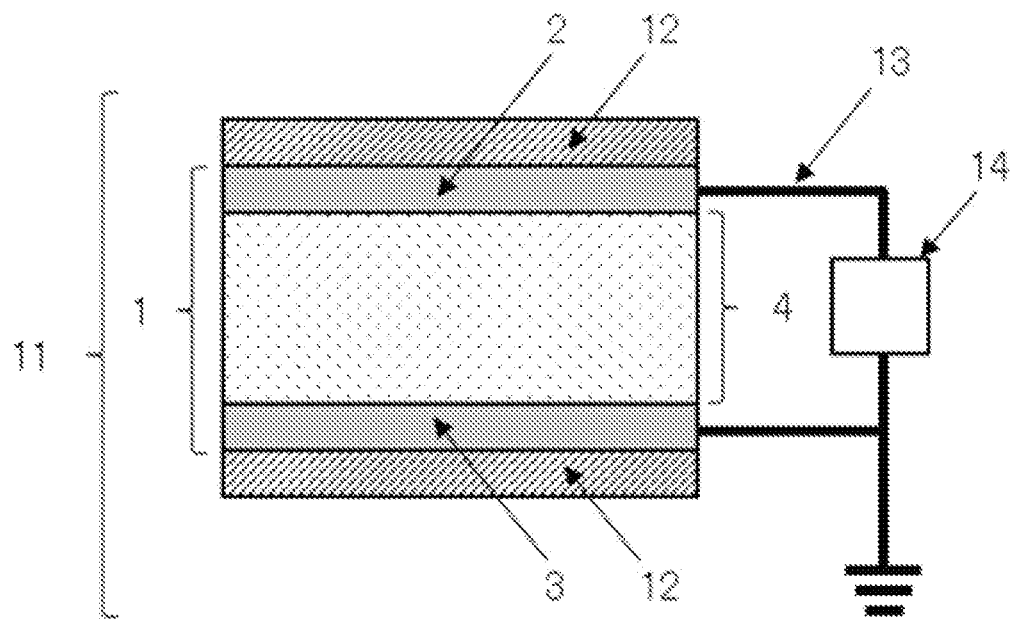

[Fig. 8]
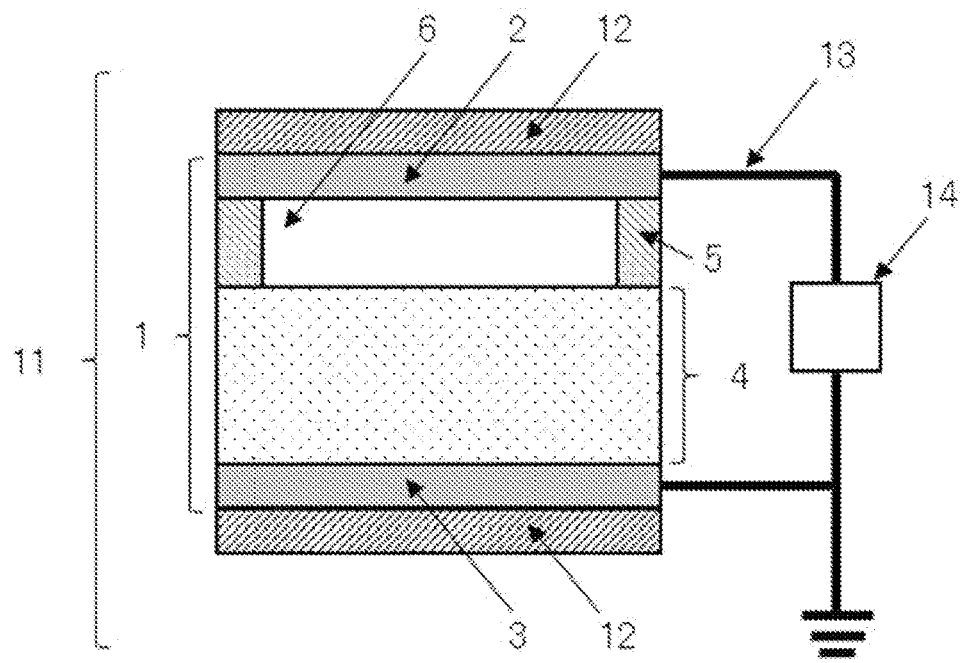
[Fig. 9]
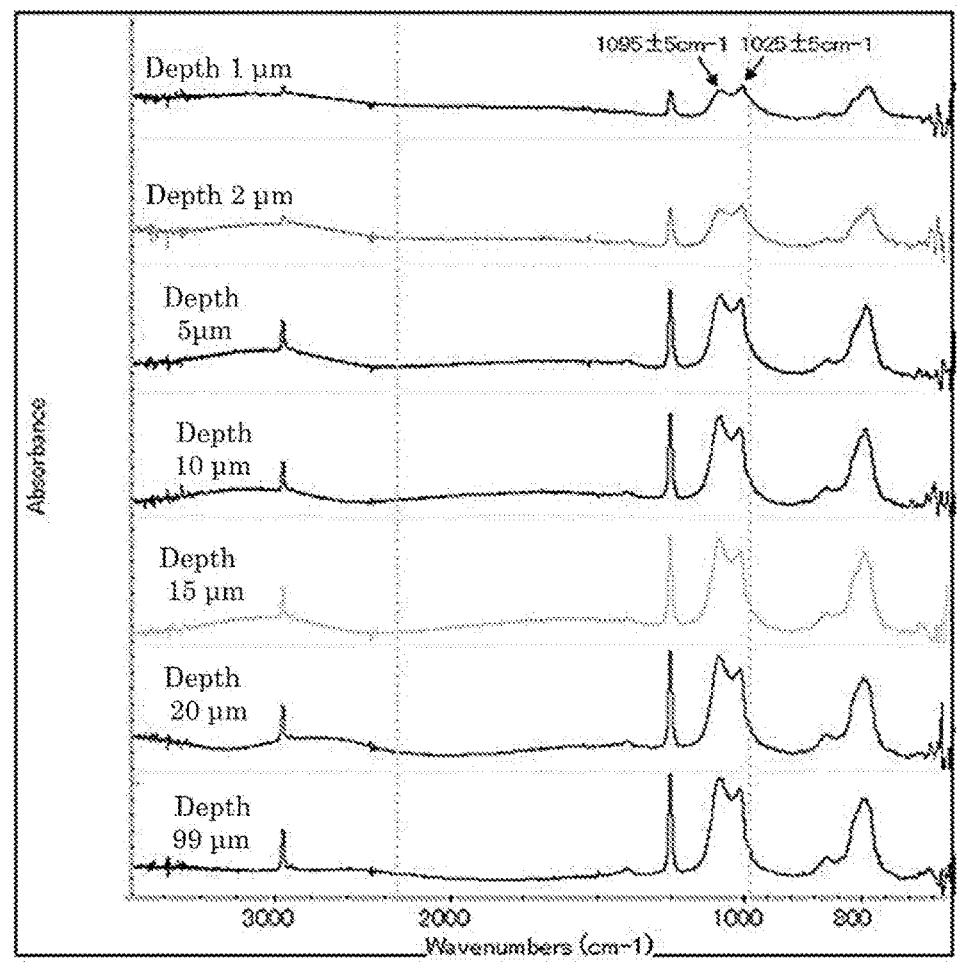

ELEMENT AND ELECTRIC GENERATOR

TECHNICAL FIELD

The present invention relates to an element and an electric generator.

BACKGROUND ART

There have been conventionally attempts for effectively utilizing the energy generated by vibrations of a structure, such as roads, bridges, and architecture, vibrations of a moving body, such as cars, and train carriages, and vibration due to human activities. As for a method for effectively utilizing the energy generated by vibrations, there is a method where vibration energy is converted into electric energy. Examples of such a method include a system utilizing a piezoelectric element, and a system utilizing electrostatic induction.

The system utilizing the piezoelectric element uses mainly a ceramic-based piezoelectric element, and utilizes a phenomenon that electric charge is induced at a surface of the piezoelectric element when distortion is applied to the piezoelectric element due to vibrations.

The system utilizing the electrostatic induction typically uses an electret dielectric retaining electric charge semipermanently (for example, see PTL 1 to PTL 5). The electret dielectric used in the aforementioned literatures is a material capable of charging the dielectric to generate an electrostatic field semipermanently. Electric charge is induced to an electrode through electrostatic induction by changing a relative position between the electret dielectric and the electrode disposed being distant from the electret dielectric due to vibrations. As a result, electricity is generated.

Since the system utilizing the piezoelectric element uses mainly a ceramic-based piezoelectric element, there are problems that the element does not have flexibility and the element is easily broken.

In the system utilizing electrostatic induction, a charging treatment needs to be performed on a dielectrics, when an electret derivative for use is produced. Examples of the charging treatment include corona discharge, and a plasma treatment. However, these treatments have a problem that a large quantity of electricity is required. Moreover, a flexibility of an element is not sufficient. In addition, a mechanical capacity varying system is typically disposed, it is difficult to realize a flexible element.

CITATION LIST

Patent Literature

PTL 1: Japanese Patent Application Laid-Open (JP-A) No. 54-014696
PTL 2: Japanese Patent (JP-B) No. 5563746
PTL 3: JP-A No. 2012-164727
PTL 4: JP-A No. 2012-164917
PTL 5: JP-A No. 2014-027756

SUMMARY OF INVENTION

Technical Problem

The present invention aims to provide element having excellent flexibility, and a high electricity generation performance.

Solution to Problem

As the means for solving the aforementioned problems, the element of the present invention includes a first electrode, an intermediate layer made of a silicone rubber composition containing a silicone rubber, and a second electrode, where the first electrode, the intermediate layer, and the second electrode are disposed in this order. A peak intensity ratio ($1095\pm5$ cm$^{-1}$/$1025\pm5$ cm$^{-1}$) of an infrared absorption spectrum of the intermediate layer varies along a vertical direction relative to a surface of the first electrode, and to a surface of the second electrode.

Advantageous Effects of Invention

The present invention can provide an element having excellent flexibility and a high electricity generation performance.

BRIEF DESCRIPTION OF DRAWINGS

FIG. 1 is a schematic cross-sectional view illustrating one example of the element of the present invention.
FIG. 2 is a schematic cross-sectional view illustrating another example of the element of the present invention.
FIG. 3 is an enlarged view illustrating one example of a cross-section of an intermediate layer in the element of the present invention.
FIG. 4 is an enlarged view illustrating one example of a cross-section of another intermediate layer in the element of the present invention.
FIG. 5 is an enlarged view illustrating one example of a cross-section of another intermediate layer in the element of the present invention.
FIG. 6 is an enlarged view illustrating one example of a cross-section of another intermediate layer in the element of the present invention.
FIG. 7 is a schematic cross-sectional view illustrating one example of the electric generator of the present invention.
FIG. 8 is a schematic cross-sectional view illustrating another example of the electric generator of the present invention.
FIG. 9 depicts infrared absorption spectrums obtained by measuring the intermediate layer produced in Example 1 at positions with different depths of the intermediate layer.

DESCRIPTION OF EMBODIMENTS (Element)
The element of the present invention includes a first electrode, an intermediate layer, and a second electrode, disposed in this order. The element of the present invention may further include other members, if necessary.

<First Electrode and Second Electrode>
A material, shape, size, and structure of each of the first electrode and the second electrode are appropriately selected depending on the intended purpose without any limitation.

The material, shape, size, and structure of the first electrode may be the same or different from the material, shape, size, and structure of the second electrode, but the material, shape, size, and structure of the first electrode are preferably the same as the material, shape, size, and structure of the second electrode.

Examples of the material of the first electrode and the second electrode include metal, a carbon-based conductive material, and a conductive rubber composition.

Examples of the metal include gold, silver, copper, iron, aluminium, stainless steel, tantalum, nickel, and phosphor bronze.

Examples of the carbon-based conductive material include graphite, carbon fiber, and carbon nanotubes.

Examples of the conductive rubber composition include a composition containing conductive filler and rubber.

Examples of the conductive filler include a carbon material (e.g., Ketjenblack, acetylene black, graphite, carbon fiber, carbon fiber (CF), carbon nanofiber (CNF), and carbon nanotube (CNTs)), metal filler (e.g., gold, silver, platinum, copper, iron, aluminium, and nickel), a conductive polymer material (e.g., a derivative of any of polythiophene, polyacetylene, polyaniline, polypyrrole, poly(p-phenylene), and poly(p-phenylene)vinylene derivative, or the derivatives doped with a dopant, such as anions, and cations), and an ionic liquid. These may be used alone, or in combination.

Examples of the rubber include silicone rubber, modified silicone rubber, acrylic rubber, chloroprene rubber, polysulfide rubber, urethane rubber, isobutyl rubber, fluorosilicone rubber, ethylene rubber, and natural rubber (latex). These may be used alone, or in combination.

Examples of the form of the first electrode and the form of the second electrode include a sheet, a film, a thin film, a woven fabric, a non-woven fabric, a mesh, and a sponge. Note that, the form of the first electrode and the form of the second electrode may be each a non-woven fabric formed by overlapping the carbon material in the form of fibers.

The shape of the first electrode and the shape of the second electrode are not particularly limited, and are appropriately selected depending on a shape of an element. The size of the first electrode and the size of the second electrode are not particularly limited, and are appropriately selected depending on a shape of an element.

The average thickness of the first electrode and the average thickness of the second electrode can be appropriately selected depending on a structure of an element. In view of conductivity and flexibility of a resulting element, the average thickness of the first electrode and the average thickness of the second electrode are preferably 0.01 μm to 1 mm, more preferably 0.1 μm to 500 μm. When the average thickness of the first electrode and the average thickness of the second electrode are 0.01 μm or greater, an appropriate mechanical strength can be attained, and thus conductivity of a resulting element improves. When the average thickness of the first electrode and the average thickness of the second electrode are 1 mm or less, a resulting element is deformable, and thus excellent electricity generation performance can be attained.

<Intermediate Layer>

The intermediate layer is made of a silicone rubber composition containing silicone rubber. A peak intensity ratio ($1095\pm5$ cm$^{-1}$/$1025\pm5$ cm$^{-1}$) of an infrared absorption spectrum of the intermediate layer varies along a vertical direction (the depth direction of the intermediate layer) relative to a surface of the first electrode, and to a surface of the second electrode. It is assumed that a potential difference is caused at both ends of the intermediate layer upon application of a distortion to generate electricity, as the peak intensity ratio of the intermediate layer composed of the silicone rubber composition varies along the depth direction of the intermediate layer.

The definition of the phrase "peak intensity ratio ($1095\pm5$ cm$^{-1}$/$1025\pm5$ cm$^{-1}$) of an infrared absorption spectrum of the intermediate layer varies" is not particularly limited, as long as the peak intensity ratio varies along the depth direction of the intermediate layer, preferably that the intermediate layer has a region the peak intensity ratio of which is different. The peak intensity ratio may change continuously, or discontinuously. Either of the peak intensity ratio of the intermediate layer at the first electrode side, or the peak intensity ratio of the intermediate layer at the second electrode side may be higher than the other.

—Measurement of Infrared Absorption Spectrum of Intermediate Layer—

The infrared absorption spectrum of the intermediate layer can be measured by cutting out a sample piece from the intermediate layer, and analyzing the depth direction (cross-section) of the sample by means of an infrared microspectrometric device.

The silicone rubber is known to have two absorption peaks attributed to Si—O—Si stretching vibrations in the region of 1150 cm$^{-1}$ to 1000 cm$^{-1}$. The peak at the higher wavelength side is attributed to symmetric stretching vibrations, and the peak at the lower wavelength side is attributed to asymmetric stretching vibrations (see I. Soga, S. Granick, Macromolecules, 1998, 31, 5450).

In the present invention, absorption peaks of the silicone rubber of the intermediate layer, which are attributed to Si—O—Si stretching vibrations, are observed at around 1095 cm$^{-1}$, and around 1025 cm$^{-1}$. Moreover, the peak intensity ratio ($1095\pm5$ cm$^{-1}$/$1025\pm5$ cm$^{-1}$) of the infrared absorption spectrum varies along the depth direction of the intermediate layer. Specifically, there is a region where a state of the Si—O—Si bond of the silicone rubber is different within the intermediate layer. It is assumed that a potential difference is caused at both ends of the intermediate layer upon application of distortion because of the aforementioned region, to thereby generate electricity.

In the present invention, the variation rate of the peak intensity ratio is preferably 0.95 or less. The variation rate is a value obtained from: a peak intensity ratio ($1095\pm5$ cm$^{-1}$/$1025\pm5$ cm$^{-1}$) of an infrared absorption spectrum of the intermediate layer measured at a position that is 1 μm in depth from a surface of the intermediate layer at a side of the first electrode; and a peak intensity ratio ($1095\pm5$ cm$^{-1}$/$1025\pm5$ cm$^{-1}$) of an infrared absorption spectrum of the intermediate layer measured at a position that is 1 μm in depth from a surface of the intermediate layer at a side of the second electrode, by dividing the peak intensity ratio that is smaller by the peak intensity ratio that is larger. When the variation rate of the peak intensity ratio is 0.95 or less, the peak intensity ratio is different along the depth direction of the intermediate layer, which means there is a region where a state of the Si—O—Si bond of the silicone rubber is different within the intermediate layer.

Examples of a method for varying the peak intensity ratio ($1095\pm5$ cm$^{-1}$/$1025\pm5$ cm$^{-1}$) of the infrared absorption spectrum along the depth direction of the intermediate layer include: a method containing performing a surface modification treatment on the intermediate layer; and a method containing adding a silicon atom-containing compound into the intermediate layer.

The intermediate layer is made of a silicone rubber composition.

The silicone rubber composition includes silicone rubber, preferably further includes filler, and may further contain other ingredients, if necessary.

—Silicone Rubber—

The silicone rubber is appropriately selected depending on the intended purpose without any limitation, provided that the silicone rubber is rubber containing organopolysiloxane bonds.

Examples of the silicone rubber include dimethyl silicone rubber, methyl phenyl silicone rubber, and modified silicone rubber (e.g., acryl-modified silicone rubber, alkyd-modified silicone rubber, ester-modified silicone rubber, and epoxy-modified silicone rubber). These may be used alone, or in combination.
The silicone rubber may be appropriately synthesized for use, or selected from commercial products. Examples of the commercial product of the silicone rubber include: IVS4312, TSE3033, and XE14-C2042 (manufactured by Momentive Performance Materials Inc.); KE-1935 (manufactured by Shin-Etsu Chemical Co., Ltd.); and DY35-2083 (manufactured by Dow Corning Toray Co., Ltd.). These may be used alone, or in combination.

—Filler—

The filler is appropriately selected depending on the intended purpose without any limitation. Examples of the filler include organic filler, inorganic filler, and organic-inorganic composite filler. It is assumed that a capacitance of the intermediate layer changes even with a small distortion, as the filler is included in the intermediate, hence increasing a quantity of electricity generating.

The organic filler is not particularly limited, as long as the organic filler is an organic compound.

Examples of the organic filler include acryl particles, polystyrene particles, melamine particles, fluororesin particles (e.g., polytetrafluoroethylene), silicone powder (e.g., silicone resin powder, silicone rubber powder, and silicone complex powder), rubber powder, wood flour, pulps, and starch.

The inorganic filler is not particularly limited, as long as the inorganic filler is an inorganic compound.

Examples of the inorganic filler include oxide, hydroxide, carbonate, sulfate, silicate, nitride, carbon, metal, and other compounds.

Examples of the oxide include silica, diatomaceous earth, alumina, zinc oxide, titanium oxide, iron oxide, and magnesium oxide.

Examples of the hydroxide include aluminium hydroxide, calcium hydroxide, and magnesium hydroxide.

Examples of the carbonate include calcium carbonate, magnesium carbonate, barium carbonate, and hydrotalcite.

Examples of the sulfate include aluminium sulfate, calcium sulfate, and barium sulfate.

Examples of the silicate include calcium silicate (e.g., wollastonite, and xonotlite), zirconium silicate, kaolin, talc, mica, zeolite, pearlite, bentonite, montmorillonite, sericite, activated clay, glass, and hollow glass beads.

Examples of the nitride include aluminium nitride, silicon nitride, and boron nitride. Examples of the carbon include Ketjenblack, acetylene black, graphite, carbon fiber, carbon fiber, carbon nanofiber, carbon nanotubes, fullerene (including derivatives), and graphene.

Examples of the metal include gold, silver, platinum, copper, iron, aluminium, and nickel.

Examples of the aforementioned other compounds include potassium titanate, barium titanate, strontium titanate, lead zirconate titanate, silicon carbide, and molybdenum sulfide.

Note that, the inorganic filler may be processed with a surface treatment.

The organic-inorganic composite filler is not particularly limited, as long as the organic-inorganic composite filler is a compound, in which an organic compound and an inorganic compound are combined at molecular level.

Examples of the organic-inorganic composite filler include silica-acryl composite particles, and silsesquioxane.

Among the filler mentioned above, a silicon atom-containing compound is preferable, because addition of the silicon atom-containing compound can increase a quantity of electricity generating.

Examples of the silicon atom-containing compound include silica, diatomaceous earth, silicate (e.g., calcium silicate (such as wollastonite, and xonotlite), zirconium silicate, kaolin, talc, mica, zeolite, pearlite, bentonite, montmorillonite, sericite, activated clay, glass, and hollow glass beads), silicone powder (e.g., silicone resin powder, silicone rubber powder, and silicone composite powder), silica-acryl composite particles, and silsesquioxane. Among them, preferred in view of an electricity generation performance are silica, kaolin, talc, wollastonite, silicone powder, and silsesquioxane.

Examples of the silica include Sylysia 430 (manufactured by Fuji Silysia Chemical Ltd.), and HS-207 (manufactured by NIPPON STEEL & SUMIKIN MATERIALS Co., Ltd.).

Examples of the kaolin include: ST-100, ST-KE, and ST-CROWN (manufactured by SHIRAISHI CALCIUM KAISHA, LTD.); and RC-1, Glomax LL, and Satintone No. 5 (manufactured by TAKEHARA KAGAKU KOGYO CO., LTD.).

Examples of the talc include: JM-209, and JM-309 (manufactured by Asada Milling Co., Ltd.); Ptalc, PHtalc, Microlight, and High micron HE5 (manufactured by TAKEHARA KAGAKU KOGYO CO., LTD.); and D-1000, D-800, SG-95, and P-3 (manufactured by NIPPON TALC Co., Ltd.).

Examples of the mica include A-11 (manufactured by YAMAGUCHI MICA CO., LTD.), and PDM-5B (manufactured by TOPY INDUSTRIES LIMITED).

Examples of the wollastonite include: Wollasto JET30w, and Wollasto 325 (manufactured by Asada Milling Co., Ltd.); and ST-40F (manufactured by SHIRAISHI CALCIUM KAISHA, LTD.).

Examples of the zeolite include SP #2300 and SP #600 (manufactured by NITTO FUNKA KOGYO K.K.).

Examples of the barium titanate include 208108 (manufactured by Sigma-Aldrich Co., LLC.).

Examples of the strontium titanate include 396141 (manufactured by Sigma-Aldrich Co., LLC.).

Examples of the sericite include ST-501 (manufactured by SHIRAISHI CALCIUM KAISHA, LTD.).

Examples of the diatomaceous earth include CT-C499 (manufactured by SHIRAISHI CALCIUM KAISHA, LTD.)

Examples of the hollow glass beads include Sphericel 110P8 (manufactured by Potters-Ballotini Co., Ltd.).

Examples of the acryl particles include FH-S005 (manufactured by TOYOBO CO., LTD.).

Examples of the polystyrene particles include 19520-500 (manufactured by Techno Chemical Corporation).

Examples of the silicone resin powder include Tospearl 120 (manufactured by Momentive Performance Materials Inc.), and KMP-590 (manufactured by Shin-Etsu Chemical Co., Ltd.) Examples of the silicone rubber powder include EP-2600 (manufactured by Dow Corning Toray Co., Ltd.), and KMP-597 (manufactured by Shin-Etsu Chemical Co., Ltd.).

Examples of the silicone composite powder include KMP-605, and X-52-7030 (manufactured by Shin-Etsu Chemical Co., Ltd.).

Examples of the silica-acryl composite particles include Soliostar RA (manufactured by NIPPON SHOKUBAI CO., LTD.).

Examples of the silsesquioxane include PPS-octamethyl substitute 526835, PPS-octaphenyl substitute 526851, and PPS-octavinyl substitute 475424 (manufactured by Sigma-Aldrich Co., LLC.).

Examples of the titanium oxide include CR-90 (manufactured by ISHIHARA SANGYO KAISHA, LTD.).

Examples of the iron oxide include Toda Color 100ED (manufactured by TODA KOGYO CORP.).

Examples of the carbon nanofiber include VGCF-H (manufactured by SHOWA DENKO K.K.).

Examples of the fullerene include nanom purple ST (manufactured by Frontier Carbon Corporation).

The average particle diameter of the filler is appropriately selected depending on the intended purpose without any limitation. The average particle diameter of the filler is preferably 0.01 µm to 30 µm, more preferably 0.1 µm to 10 µm. When the average particle diameter of the filler is 0.01 µm or greater, an electricity generation performance of a resulting element may improve. When the average particle diameter of the filler is 30 µm or less, the intermediate layer has excellent flexibility, and thus an electricity generation performance of a resulting element may be enhanced.

The average particle diameter can be measured in accordance with a conventional method, for example, by means of Microtrac HRA (manufactured by NIKKISO CO., LTD.).

The amount of the filler relative to 100 parts by mass of the silicone rubber is preferably 0.1 parts by mass to 100 parts by mass, more preferably 1 part by mass to 50 parts by mass. When the amount of the filler is 0.1 parts by mass or greater, an electricity generation performance of a resulting element may be improved. When the amount of the filler is 100 parts by mass or less, moreover, the intermediate layer has excellent flexibility, and the electricity generation performance can be enhanced.

—Other Ingredients—

The aforementioned other ingredients are appropriately selected depending on the intended purpose without any limitation. Examples of the ingredients include rubber, and additives. The amount of the ingredients can be appropriately selected, provided that the ingredients of such amount does not impart an obtainable effect of the present invention.

Examples of the rubber include fluorosilicone rubber, acrylic rubber, chloroprene rubber, natural rubber (latex), urethane rubber, fluororubber, and ethylene propylene rubber.

Examples of the additives include a crosslinking agent, an antidegradant, a heat-proof agent, and a colorant.

—Preparation of Silicone Rubber Composition—

The silicone rubber composition can be prepared by mixing the silicone rubber, the filler, and optional other ingredients, and kneading and dispersing the mixture.

—Formation Method of Intermediate Layer—

The formation method of the intermediate layer is appropriately selected depending on the intended purpose without any limitation. Examples of the formation method include a method including applying the silicone rubber composition onto a base material by blade coating, die coating, or dip coating, followed by curing the silicone rubber composition with heat or electron beams.

The intermediate layer may be a single layer, or multiple layers.

The average thickness of the intermediate layer is appropriately selected depending on the intended purpose without any limitation. The average thickness of the intermediate layer is preferably 1 µm to 10 mm, more preferably 20 µm to 200 µm. When the average thickness is 1 µm or greater, an appropriate mechanical strength can be attained, and thus an electricity generation performance of a resulting element improves. When the average thickness is 10 mm or less, the intermediate layer has excellent flexibility, and thus an electricity generation performance of a resulting element improves.

As for electrical properties of the intermediate layer, the intermediate layer is preferably insulation. As for the insulation properties, the intermediate layer preferably has volume resistivity of 108 Ωcm or greater, more preferably $10^{10}$ Ωcm or greater. By adjusting the volume resistivity of the intermediate layer to the aforementioned preferred numerical range, an excellent electricity generation performance can be achieved.

—Surface Modification Treatment of intermediate Layer—

The intermediate layer is preferably subjected to a surface modification treatment.

The surface modification treatment is appropriately selected depending on the intended purpose without any limitation, provided that the surface modification treatment is a treatment where a certain degree of radiation energy is applied to a material to modify the material. Examples of the surface modification treatment include a plasma treatment, a corona discharge treatment, an electron-beam irradiation treatment, a UV-ray irradiation treatment, an ozone treatment, and a radial-ray (X-ray, α-ray, β-ray, γ-ray, or neutron) irradiation treatment. Among them, preferred in view of a processing speed are a plasma treatment, a corona discharge treatment, and an electron-beam irradiation treatment.

——Plasma Treatment——

In case of the plasma treatment, a plasma generating device is, for example, an atmospheric pressure plasma device, as well as a parallel-plate plasma device, a capacity-coupled plasma device, or an inductively-coupled plasma device. In view of durability, the plasma treatment is preferably a low-pressure plasma treatment.

The reaction pressure of the plasma treatment is appropriately selected depending on the intended purpose without any limitation. The reaction pressure is preferably 0.05 Pa to 100 Pa, more preferably 1 Pa to 20 Pa.

The reaction atmosphere of the plasma treatment is appropriately selected depending on the intended purpose without any limitation. For example, gas, such as inert gas, noble gas, and oxygen, is effective as the reaction atmosphere. The reaction atmosphere is preferably argon in view of continuity of an effect. Moreover, it is preferred that the oxygen partial pressure of the reaction atmosphere be adjusted to 5,000 ppm or less. When the oxygen partial pressure of the reaction atmosphere is 5,000 ppm or less, generation of ozone can be suppressed, and use of an ozone processing device can be avoided.

The electricity radiation does in the plasma treatment is defined by (output×irradiation duration). The electricity radiation does is preferably 5 Wh to 200 Wh, more preferably 10 Wh to 50 Wh. When the electricity radiation does is within the aforementioned preferred range, an electricity generating function can be imparted to the intermediate layer, and durability can be maintained, as an excessive amount of the energy is not applied.

——Corona Discharge Treatment——

The applied energy (cumulative energy) in the corona discharge treatment is preferably 6 J/cm$^2$ to 300 J/cm$^2$, more preferably 12 J/cm$^2$ to 60 J/cm$^2$. When the applied energy is within the aforementioned preferred range, excellent electricity generation performance and durability can be achieved.

The applied voltage in the corona discharge treatment is preferably 50 V to 150 V, more preferably 100 V. The reaction atmosphere of the corona discharge treatment is preferably air.

——Electron-Beam Irradiation Treatment——

The radiation dose of the electron-beam irradiation treatment is preferably 1 kGy or greater, more preferably 300 kGy to 10 MGy. When the radiation dose is within the aforementioned preferred range, an electricity generating function can be imparted to the intermediate layer, and durability can be maintained, as an excessive amount of the energy is not applied.

The reaction atmosphere of the electron-beam irradiation treatment is appropriately selected depending on the intended purpose without any limitation. The reaction atmosphere is preferably an atmosphere the oxygen partial pressure of which is adjusted to 5,000 ppm or less by filling with inert gas, such as argon, neon, helium, and nitrogen. When the oxygen partial pressure of the reaction atmosphere is 5,000 ppm or less, generation of ozone can be suppressed, and use of an ozone processing device can be avoided.

——UV-Ray Irradiation Treatment——

UV rays used in the UV-ray irradiation treatment preferably have wavelengths of 200 nm to 365 nm, more preferably 240 nm to 320 nm.

The cumulative radiation of the UV-ray irradiation treatment is preferably 5 J/cm$^2$ to 500 J/cm$^2$, more preferably 50 J/cm$^2$ to 400 J/cm$^2$. When the cumulative radiation is within the aforementioned preferred range, an electricity generating function can be imparted to the intermediate layer, and durability can be maintained, as an excessive amount of the energy is not applied.

The reaction atmosphere of the UV-ray irradiation treatment is appropriately selected depending on the intended purpose without any limitation. The reaction atmosphere is preferably an atmosphere the oxygen partial pressure of which is adjusted to 5,000 ppm or less by filling with inert gas, such as argon, neon, helium, and nitrogen. When the oxygen partial pressure of the reaction atmosphere is 5,000 ppm or less, generation of ozone can be suppressed, and use of an ozone processing device can be avoided.

In the related art, proposed is that an interlayer adhesion is enhanced by exciting or oxidizing a material through a plasma treatment, a corona discharge treatment, a UV-ray irradiation treatment, or an electron-beam irradiation treatment, to thereby form active groups. However, these techniques are only limited to the application between layers, and are not suitable for an outermost surface, as lubricity are lowered. Moreover, a reaction of any of the aforementioned treatments is performed in an oxygen-rich state, to effectively introduce reaction active groups (hydroxyl groups). Accordingly, the aforementioned related art is fundamentally different from the surface modification treatment performed in the present invention.

The surface modification treatment is a treatment (e.g., a plasma treatment) that is performed in a reaction environment of a low oxygen content with reduced pressure. Therefore, the surface modification treatment accelerates re-crosslinking and bonding of the surface to improve durability, for example, owing to "an increase of Si—O bonds having high bonding energy," as well as improving lubricity owing to "high density because of an improved crosslinking density."

FIG. 3 is a schematic cross-sectional view illustrating an enlarged example of a microstructure of the intermediate layer 4 constituting the element of the present invention.

The intermediate layer 4 is made of a silicone rubber composition containing silicone rubber 7. A peak intensity ratio (1095±5 cm$^{-1}$/1025±5 cm$^{-1}$) of the infrared absorption spectrum of the intermediate layer 4 varies along a vertical direction (depth direction of the intermediate layer) relative to the surface of the first electrode and the surface of the second electrode.

In the intermediate layer 4, the region 9 where the peak intensity ratio of the intermediate layer is small is continuously changed to the region 10 where the peak intensity ratio of the intermediate layer is large.

FIG. 4 is a schematic cross-sectional view illustrating enlarged another example of a microstructure of the intermediate layer 4 constituting the element of the present invention.

The intermediate layer 4 is made of a silicone rubber composition containing silicone rubber 7. A peak intensity ratio (1095±5 cm$^{-1}$/1025±5 cm$^{-1}$) of the infrared absorption spectrum of the intermediate layer 4 varies along a vertical direction (depth direction of the intermediate layer) relative to the surface of the first electrode and the surface of the second electrode.

In the intermediate layer 4, the region 9 where the peak intensity ratio of the intermediate layer is small and the region 10 where the peak intensity ratio of the intermediate layer is large is separated at an interface, and the peak intensity ratio is discontinuously changed FIG. 5 is a cross-sectional view illustrating enlarged another example of a microstructure of the intermediate layer 4 constituting the element of the present invention.

The intermediate layer 4 is made of a silicone rubber composition containing silicone rubber 7 and filler 8.

A peak intensity ratio (1095±5 cm$^{-1}$/1025±5 cm$^{-1}$) of the infrared absorption spectrum of the intermediate layer 4 varies along a vertical direction (depth direction of the intermediate layer) relative to the surface of the first electrode and the surface of the second electrode.

In the intermediate layer 4, the region 9 where the peak intensity ratio of the intermediate layer is small and the region 10 where the peak intensity ratio of the intermediate layer is large is separated at an interface, and the peak intensity ratio is discontinuously changed The filler 8 may be homogeneously dispersed in the intermediate layer 4, or locally disposed in the region 9 where the peak intensity of the intermediate layer is small, or the region 10 where the peak intensity of the intermediate layer is large.

FIG. 6 is a cross-sectional view illustrating enlarged another example of a microstructure of the intermediate layer 4 constituting the element of the present invention.

The intermediate layer 4 is made of a silicone rubber composition containing silicone rubber 7 and filler 8.

A peak intensity ratio (1095±5 cm$^{-1}$/1025±5 cm$^{-1}$) of the infrared absorption spectrum of the intermediate layer 4 varies along a vertical direction (depth direction of the intermediate layer) relative to the surface of the first electrode and the surface of the second electrode.

In the intermediate layer 4, the region 9 where the peak intensity ratio of the intermediate layer is small and the region 10 where the peak intensity ratio of the intermediate layer is large is separated at an interface, and the peak intensity ratio is discontinuously changed The filler 8 may be homogeneously dispersed in the intermediate layer 4, or locally disposed in the region 9 where the peak intensity of the intermediate layer is small, or the region 10 where the peak intensity of the intermediate layer is large.

—Space—

The element preferably has a space disposed between the intermediate layer and the first electrode, or between the intermediate layer and the second electrode, or both. As the space is provided, the capacitance of the element is changed even with weak vibrations, to thereby increase a quantity of electricity generating.

It is preferred in view of the electric generation efficiency that the space be disposed at a surface of the intermediate layer at which the peak intensity ratio ($1095\pm5$ cm$^{-1}$/$1025\pm5$ cm$^{-1}$) of the infrared absorption spectrum is smaller.

A method for disposing the space is appropriately selected depending on the intended purpose without any limitation. Examples of the method include a method where a spacer is disposed between the intermediate layer and the first electrode, or between the intermediate layer and the second electrode, or both.

——Spacer——

A material, form, shape, and size of the spacer are appropriately selected depending on the intended purpose without any limitation.

Examples of the material of the spacer include a polymer material, rubber, metal, a conductive polymer material, and a conductive rubber composition.

Examples of the polymer material include polyethylene, polypropylene, polyethylene terephthalate, polyvinyl chloride, a polyimide resin, a fluororesin, and an acrylic resin.

Examples of the rubber include silicone rubber, modified silicone rubber, acrylic rubber, chloroprene rubber, polysulfide rubber, urethane rubber, isobutyl rubber, fluorosilicone rubber, ethylene rubber, and natural rubber (latex).

Examples of the metal include gold, silver, copper, aluminium, stainless steel, tantalum, nickel, and phosphor bronze.

Examples of the conductive polymer material include polythiophene, polyacetylene, and polyaniline.

Examples of the conductive rubber composition include a composition containing conductive filler and rubber. Examples of the conductive filler include a carbon material (e.g., Ketjenblack, acetylene black, graphite, carbon fiber, carbon fiber, carbon nanofiber, and carbon nanotubes), metal (e.g., gold, silver, platinum, copper, iron, aluminium, and nickel), a conductive polymer material (e.g., a derivative of any of polythiophene, polyacetylene, polyaniline, polypyrrole, poly(p-phenylene), and poly(p-phenylene)vinylene, and the derivative doped with a dopant, such as anions, and cations), and an ionic liquid.

Examples of the rubber include silicone rubber, modified silicone rubber, acrylic rubber, chloroprene rubber, polysulfide rubber, urethane rubber, isobutyl rubber, fluorosilicone rubber, ethylene rubber, and natural rubber (latex).

Examples of the form of the spacer include a sheet, a film, a woven fabric, a non-woven fabric, a mesh, and a sponge.

The shape, size, thickness, and position to be disposed are appropriately selected depending on a structure of an element.

It is preferred that the intermediate layer does not have an initial surface potential in the standing state.

Note that, the initial surface potential in the standing state can be measured under the following measuring conditions. Note that, the phrase "not having an initial surface potential" means that the initial surface potential as measured under the following conditions is $\pm10$ V or less.

<Measuring Conditions>

Pretreatment: After leaving a sample to stand in the atmosphere having the temperature of 30° C., and the relative humidity of 40% for 24 hours, neutralization was performed for 60 seconds (using SJ-F300, manufactured by Keyence Corporation)

Device: Treck Model344

Measuring probe: 6000B-7C

Measuring distance: 2 mm

Measuring spot diameter: 10 mm in diameter ($\Phi$)

For example, the element of the present invention is suitably used for an electricity generating element, various sensors, and various actuators.

The element of the present invention is considered to be different in terms of principles of electricity generation from the related art disclosed in JP-A No. 54-014696, JP-B No. 5563746, and JP-A Nos. 2012-164727, 2012-164917, and 2014-027756 (PTL 1 to PTL 5), because the intermediate layer of the element of the present invention does not have initial surface potential.

The element of the present invention deforms to generate electricity, as a load, such as an external force or vibrations is applied to the element. The mechanism of electric generation of the element of the present invention has not been clarified, but it is assumed as follows. As a load is applied, the intermediate layer adjacent to the electrode is charged with a mechanism similar to friction charging, or charge is generated inside the intermediate layer. As a result of the aforementioned charging, a difference in surface potential is caused within the element. The charge is moved to make the surface potential difference zero, to thereby generate electricity.

FIG. 1 is a schematic cross-sectional view illustrating one example of the element of the present invention. The element 1 illustrated in FIG. 1 includes a pair of electrodes (a first electrode 2 and a second electrode 3), and an intermediate layer 4.

Moreover, FIG. 2 is a schematic cross-sectional view illustrating another example of the element of the present invention. In the element 1 illustrated in FIG. 2, a space 6 is disposed with a spacer 5 between the first electrode 2 and the intermediate layer 4. As there is the space 6 in the element 1, the element 1 illustrated in FIG. 2 has a structure that can be easily deformed.

Note that, the space 6 can be disposed between the intermediate layer and the first electrode 2, or between the intermediate layer and the second electrode 3, or both.

(Electric Generator)

The electric generator of the present invention includes at least the element of the present invention, and may further include other members, if necessary. Since the electric generator uses the element of the present invention, the electric generator does not require application of high voltage at the time of operation.

Once a load, such as an external force, and vibrations, is applied to the electric generator of the present invention, the element is deformed, to thereby generate electricity. The electric generation mechanism of the electric generator has not yet been clearly found out. It is however assumed as follows. As a load is applied, the intermediate layer adjacent to the electrode is charged with a mechanism similar to friction charging, or charge is generated inside the intermediate layer. If the element is deformed in this state, capacitance is changed to cause a difference in surface potential within the element. The charge is moved to make the surface potential difference zero, to thereby generate electricity.

<Other Members>

Examples of the aforementioned other members include a cover material, an electrical wire, and an electric circuit.

—Cover Material—

The cover material is appropriately selected depending on the intended purpose without any limitation.

Examples of a material of the cover material include a polymer material, and rubber. Examples of the polymer material include polyethylene, polypropylene, polyethylene terephthalate, polyvinyl chloride, a polyimide resin, a fluororesin, and an acrylic resin. Examples of the rubber include silicone rubber, modified silicone rubber, acrylic rubber, chloroprene rubber, polysulfide rubber, urethane rubber, isobutyl rubber, fluorosilicone rubber, ethylene rubber, and natural rubber (latex).

A structure, shape, size, and thickness of the cover material are appropriately selected depending on an electric generator, without any limitation.

—Electrical Wire—

The electrical wire is appropriately selected depending on the intended purpose without any limitation.

Examples of a material of the electrical wire include metal and alloy. Examples of the metal include gold, silver, copper, aluminium, and nickel.

A structure, shape, and thickness of the electrical wire are appropriately selected depending on an electric generator without any limitation.

—Electric Circuit—

The electric circuit is appropriately selected depending on the intended purpose without any limitation, provided that the electric circuit is a circuit from which electricity generated in the element is taken out.

Examples of the electric circuit include a rectifier circuit, an oscilloscope, a voltmeter, an ammeter, a storage circuit, an LED, and various sensors (e.g., an ultrasonic sensor, a pressure sensor, a tactile sensor, a distortion sensor, an acceleration sensor, a shock sensor, a vibration sensor, a pressure-sensitive sensor, an electric field sensor, and a sound pressure sensor).

<Use>

For example, the electric generator is suitably used for various sensors, such as an ultrasonic sensor, a pressure sensor, a tactile sensor, a distortion sensor, an acceleration sensor, a shock sensor, a vibration sensor, a pressure-sensitive sensor, an electric field sensor, and a sound pressure sensor. Particularly, the electric generator is suitably used for a wearable sensor, as high voltage is not required. Moreover, the electric generator is suitably used as a piezoelectric film having excellent processability in a head phone, a speaker, a microphone, a hydrophone, a display, a fan, a pump, a variable focal lens, an ultrasonic transducer, a piezoelectric transformer, a sound insulator, a sound-proofing material, an actuator, or a keyboard. Moreover, the electric generator can be used for an audio system, an information processing device, a measuring device, a medical device, a vehicle, a building, a damping material (damper) used for sports equipment, such as ski, and a racket, and other fields.

Furthermore, the electric generator is suitably used for the following applications.

Generation of electricity using natural energy, such as wave power, water power, and wind power.

Generation of electricity by walking by humans, when the electric generator is embedded in shoes, clothes, a floor, or accessories.

Generation of electricity using vibrations caused by traveling, when the electric generator is embedded in tires of automobiles.

Moreover, the electric generator is expected to be applied as a plate electric generator prepared by forming the electric generator on a flexible substrate, a secondary battery that is charged by applying voltage, or a novel actuator (e.g., artificial muscles).

FIG. 7 is a cross-sectional view illustrating one example of a structure of the electric generator of the present invention. The electric generator 11 illustrated in FIG. 7 includes an element 1, cover materials 12, electrical wires 13, and an electric circuit 14.

Moreover, FIG. 8 is a cross-sectional view illustrating another example of a structure of the electric generator of the present invention. In the element 1 of the electric generator 11 illustrated in FIG. 8, a space 6 is disposed. Since the element 1 has the space 6, the element 1 has a structure that is easily deformed. Accordingly, a capacitance of the element changes even with weak vibrations to thereby increase a quantity of electricity generating.

EXAMPLES

Examples of the present invention are described hereinafter, but these examples shall not construed as to limit the scope of the present invention in any way.

Example 1

<Productions of Element and Electric Generator>

—Production of Intermediate Layer—

Silicone rubber (IVS4312, manufactured by Momentive Performance Materials Inc.) was applied onto a polyethylene terephthalate (PET) film, and the applied silicone rubber composition was heated to cure at 120° C. for 30 minutes, to thereby form a thin film having a thickness of 100 µm.

Subsequently, the thin film was subjected to a corona discharge treatment under the following conditions. Thereafter, the PET film was peeled. In the manner as described above, an intermediate layer was obtained.

<Conditions of Corona Discharge>

Applied voltage: 100 V

Cumulative energy: 60 J/cm$^2$

Reaction atmosphere: air

—First Electrode and Second Electrode—

As for each of a first electrode and a second electrode, AL-PET 9-100 (thickness of aluminium foil: 9 µm, thickness of polyethylene terephthalate film: 100 µm (cover material)) manufactured by PANAC CO., LTD. was provided.

—Production of Element—

The obtained intermediate layer was sandwiched with the first electrode and the second electrode, and a lead wire (C3/RV-90 0.75SQ, manufactured by Taiyo Cabletec Corporation) was attached to the assembly, to thereby obtain an element of Example 1.

—Production of Electric Generator—

Oscilloscope (WaveAce1001, manufactured by Teledyne LeCroy Japan Corporation) was attached to the obtained element, to thereby produce an electric generator of Example 1.

<Evaluation>

<<Measurement of Infrared Absorption Spectrum>>

A sample piece was cut out from the produced intermediate layer of Example 1 using Microtome (FCS, manufactured by Leica Biosystems Nussloch GmbH), and then placed on a Si wafer. Subsequently, the sample piece was subjected to a measurement by means of an infrared microspectrometric device (Sptlight400, manufactured PerkinElmer Inc.) while varying a depth direction of the sample piece with setting the surface of the intermediate layer subjected to the corona discharge treatment as a 0 µm depth. As a result, an infrared absorption spectrum illustrated in FIG. 9 was obtained. It was found from the result of FIG. 9 that the peak intensity ratio (1095±5 cm$^{-1}$/1025±5 cm$^{-1}$) of the intermediate layer of Example 1 was varied along the depth direction of the intermediate layer, the peak intensity ratio at the depth of 1 μm was 0.89, the peak intensity ratio at the depth of 99 μm was 1.17, and the variation rate of the peak intensity ratio (the peak intensity ratio at the depth of 1 μm/the peak intensity ratio at the depth of 99 μm=0.89/1.17) was 0.76. As a result, it was confirmed that a region where a state of a Si—O—Si bond of the silicone rubber was different was present in the intermediate layer of Example 1.

<<Evaluation of Electricity Generation Performance>>

An iron ball (weight: 200 g) was dropped from 10 cm high on the produced electric generator of Example 1. The peak voltage amount as generated between the both electrodes was measured by an oscilloscope (WaveAce1001, manufactured by Teledyne LeCroy Japan Corporation). The measurement was performed 5 times, and the obtained average value was provided as a measured value. The ratio of the measured value relative to the measured value of Comparative Example 1 was determined, and evaluated based on the following evaluation criteria. The result is presented in Table 1-4.

<Evaluation Criteria>

Rank A: The value was 15 times or greater compared to Comparative Example 1, and the electricity generation performance is significantly improved.

Rank B: The value was 10 times or greater but less than 15 times, compared to Comparative Example 1, and the electricity generation performance is significantly improved.

Rank C: The value was 5 times or greater but less than 10 times, compared to Comparative Example 1, and the electricity generation performance is improved.

Rank D: The value was greater than 1 time but less than 15 times, compared to Comparative Example 1, and the electricity generation performance is slightly improved.

Rank E: The value was 1 time, compared to Comparative Example 1, and the electricity generation performance is identical.

Rank F: The value was less than 1 time, compared to Comparative Example 1, and the electricity generation performance is degraded.

Example 2

<Productions of Element and Electric Generator>
—Production of Intermediate Layer—
Silicone rubber (KE-1935, manufactured by Shin-Etsu Chemical Co., Ltd.) was applied onto a polyethylene terephthalate (PET) film, and the applied silicone rubber composition was heated to cure at 120° C. for 30 minutes, to thereby form a thin film having a thickness of 100 μm. Subsequently, the thin film was subjected to a corona discharge treatment in the same manner as in Example 1. Then, the PET film was peeled to thereby produce an intermediate layer of Example 2.

—Productions of Element and Electric Generator—

An element and an electric generator of Example 2 were produced using the produced intermediate layer in the same manner as in Example 1.

<Evaluation>

<<Measurement of Infrared Absorption Spectrum>>

The produced intermediate layer of Example 2 was subjected to a measurement of an infrared absorption spectrum in the same manner as in Example 1. As a result, the variation rate of the peak intensity ratio was 0.80. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 2 was evaluated in the same manner as in Example 1. The result is presented in Table 1-4.

Example 3

<Productions of Element and Electric Generator>
—Production of Intermediate Layer—

A silicone rubber composition was prepared by dispersing 100 parts by mass of silicone rubber (IVS4312, manufactured by Momentive Performance Materials Inc.), 50 parts by mass of barium titanate (208108, manufactured by Sigma-Aldrich Co., LLC.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 μm.

Subsequently, the thin film was subjected to a corona discharge treatment in the same manner as in Example 1. Then, the PET film was peeled to thereby produce an intermediate layer of Example 3.

—Productions of Element and Electric Generator—

An element and an electric generator of Example 3 were produced using the produced intermediate layer in the same manner as in Example 1.

<Evaluation>

<<Measurement of Infrared Absorption Spectrum>>

The produced intermediate layer of Example 3 was subjected to a measurement of an infrared absorption spectrum in the same manner as in Example 1. As a result, the variation rate of the peak intensity ratio was 0.91. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 3 was evaluated in the same manner as in Example 1. The result is presented in Table 1-4.

Example 4

<Productions of Element and Electric Generator>
—Production of Intermediate Layer—

A silicone rubber composition was prepared by dispersing 100 parts by mass of silicone rubber (IVS4312, manufactured by Momentive Performance Materials Inc.), and 50 parts by mass of strontium titanate (396141, manufactured by Sigma-Aldrich Co., LLC.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 μm.

Subsequently, the thin film was subjected to a corona discharge treatment in the same manner as in Example 1. Then, the PET film was peeled to thereby produce an intermediate layer of Example 4.

—Productions of Element and Electric Generator—

An element and an electric generator of Example 4 were produced using the produced intermediate layer in the same manner as in Example 1.

<Evaluation>

<<Measurement of Infrared Absorption Spectrum>>

The produced intermediate layer of Example 4 was subjected to a measurement of an infrared absorption spectrum in the same manner as in Example 1. As a result, the variation rate of the peak intensity ratio was 0.91. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 4 was evaluated in the same manner as in Example 1. The result is presented in Table 1-4.

Example 5

<Productions of Element and Electric Generator>

—Production of Intermediate Layer—

A silicone rubber composition was prepared by dispersing 100 parts by mass of silicone rubber (IVS4312, manufactured by Momentive Performance Materials Inc.), 10 parts by mass of silica (Sylysia 430, manufactured by Fuji Silysia Chemical Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 200 μm.

Subsequently, the thin film was subjected to a plasma treatment (treatment conditions, a device for use: PR-500, manufactured by Yamato Scientific Co., Ltd., output: 100 W, processing time: 4 minutes, reaction atmosphere: argon 99.999%, reaction pressure: 10 Pa). Thereafter, the PET film was peeled. In the manner as described above, an intermediate layer was obtained.

—First Electrode and Second Electrode—

As for each of a first electrode and a second electrode, a conductive cloth Sui-80-M30 (thickness of non-woven fabric plated with copper and nickel: 35 μm) manufactured by SEIREN Co., Ltd. was provided.

—Production of Element—

The obtained intermediate layer was sandwiched with the first electrode and the second electrode, and a lead wire (C3/RV-90 0.75SQ, manufactured by Taiyo Cabletec Corporation) was attached to the assembly. The resultant was further sandwiched with cover materials (SLF-K02G, manufactured by EUROPORT, thickness of polyvinyl chloride film: 80 μm), to thereby produce an element of Example 5.

—Production of Electric Generator—

Oscilloscope (WaveAce1001, manufactured by Teledyne LeCroy Japan Corporation) was attached to the obtained element, to thereby produce an electric generator of Example 5.

<Evaluation>

<<Measurement of Infrared Absorption Spectrum>>

The produced intermediate layer of Example 5 was subjected to a measurement of an infrared absorption spectrum in the same manner as in Example 1. As a result, the variation rate of the peak intensity ratio was 0.81. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 5 was evaluated in the same manner as in Example 1. The result is presented in Table 1-4.

Example 6

<Productions of Element and Electric Generator>

—Production of Intermediate Layer, and Preparation of First Electrode and Second Electrode—

An intermediate layer was produced, and a first electrode and a second electrode were prepared in the same manner as in Example 5.

—Production of Element—

The obtained intermediate layer was sandwiched with the first electrode and the second electrode, and a lead wire (C3/RV-90 0.75SQ, manufactured by Taiyo Cabletec Corporation) was attached to the assembly. The resultant was further sandwiched with cover materials (SLF-K02G, manufactured by EUROPORT, thickness of polyvinyl chloride film: 80 μm), to thereby produce an element.

In the course of the production of the element, a space was disposed via a spacer (H10 LUMIRROR #500, manufactured by TORAY INDUSTRIES, INC., thickness of polyethylene terephthalate film: 480 μm) between the electrode and the surface of the intermediate layer at which the peak intensity ratio ($1095\pm5$ cm$^{-1}$/$1025\pm5$ cm$^{-1}$) of the infrared absorption spectrum of the intermediate layer was larger. In the manner as described above, an element of Example 6 was produced.

—Production of Electric Generator—

Oscilloscope (WaveAce1001, manufactured by Teledyne LeCroy Japan Corporation) was attached to the obtained element, to thereby produce an electric generator of Example 6.

<Evaluation>

<<Measurement of Infrared Absorption Spectrum>>

The produced intermediate layer of Example 6 was subjected to a measurement of an infrared absorption spectrum in the same manner as in Example 1. As a result, the variation rate of the peak intensity ratio was 0.81. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 6 was evaluated in the same manner as in Example 1. The result is presented in Table 1-4.

Example 7

<Productions of Element and Electric Generator>

—Production of Intermediate Layer, and Preparation of First Electrode and Second Electrode—

An intermediate layer was produced, and a first electrode and a second electrode were prepared in the same manner as in Example 5.

—Production of Element—

The obtained intermediate layer was sandwiched with the first electrode and the second electrode, and a lead wire (C3/RV-90 0.75SQ, manufactured by Taiyo Cabletec Corporation) was attached to the assembly. The resultant was further sandwiched with cover materials (SLF-K02G, manufactured by EUROPORT, thickness of polyvinyl chloride film: 80 μm), to thereby produce an element.

In the course of the production of the element, a space was disposed via a spacer (H10 LUMIRROR #500, manufactured by TORAY INDUSTRIES, INC., thickness of polyethylene terephthalate film: 480 μm) between the electrode and the surface of the intermediate layer at which the peak intensity ratio ($1095\pm5$ cm$^{-1}$/$1025\pm5$ cm$^{-1}$) of the infrared absorption spectrum of the intermediate layer was smaller. In the manner as described above, an element of Example 7 was produced.

—Production of Electric Generator—

Oscilloscope (WaveAce1001, manufactured by Teledyne LeCroy Japan Corporation) was attached to the obtained element, to thereby produce an electric generator of Example 7.

<Evaluation>

<<Measurement of Infrared Absorption Spectrum>>

The produced intermediate layer of Example 7 was subjected to a measurement of an infrared absorption spectrum in the same manner as in Example 1. As a result, the variation rate of the peak intensity ratio was 0.81. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 7 was evaluated in the same manner as in Example 1. The result is presented in Table 1-4.

Example 8

<Productions of Element and Electric Generator>

—Production of Intermediate Layer—

A silicone rubber composition was prepared by dispersing 100 parts by mass of silicone rubber (IVS4312, manufactured by Momentive Performance Materials Inc.), and 50 parts by mass of silica (Sylysia 430, manufactured by Fuji Silysia Chemical Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 200 μm.

Subsequently, the thin film was subjected to a corona discharge treatment in the same manner as in Example 5. Then, the PET film was peeled to thereby produce an intermediate layer of Example 8.

—Productions of Element and Electric Generator—

An element and an electric generator of Example 8 were produced using the produced intermediate layer in the same manner as in Example 7.

<Evaluation>

<<Measurement of Infrared Absorption Spectrum>>

The produced intermediate layer of Example 8 was subjected to a measurement of an infrared absorption spectrum in the same manner as in Example 1. As a result, the variation rate of the peak intensity ratio was 0.87. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 8 was evaluated in the same manner as in Example 1. The result is presented in Table 1-4.

Example 9

<Productions of Element and Electric Generator>

—Production of Intermediate Layer—

A silicone rubber composition was prepared by dispersing 100 parts by mass of silicone rubber (IVS4312, manufactured by Momentive Performance Materials Inc.), and 60 parts by mass of silica (Sylysia 430, manufactured by Fuji Silysia Chemical Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 200 μm.

Subsequently, the thin film was subjected to a corona discharge treatment in the same manner as in Example 5. Then, the PET film was peeled to thereby produce an intermediate layer of Example 9.

—Productions of Element and Electric Generator—

An element and an electric generator of Example 9 were produced using the produced intermediate layer in the same manner as in Example 7.

<Evaluation>

<<Measurement of Infrared Absorption Spectrum>>

The produced intermediate layer of Example 9 was subjected to a measurement of an infrared absorption spectrum in the same manner as in Example 1. As a result, the variation rate of the peak intensity ratio was 0.88. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 9 was evaluated in the same manner as in Example 1. The result is presented in Table 1-4.

Example 10

<Productions of Element and Electric Generator>

—Production of Intermediate Layer—

A silicone rubber composition was prepared by dispersing 100 parts by mass of silicone rubber (IVS4312, manufactured by Momentive Performance Materials Inc.), and 10 parts by mass of silica (Sylysia 430, manufactured by Fuji Silysia Chemical Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 20 μm.

Subsequently, the thin film was subjected to a corona discharge treatment in the same manner as in Example 5. Then, the PET film was peeled to thereby produce an intermediate layer of Example 10.

—Productions of Element and Electric Generator—

An element and an electric generator of Example 10 were produced using the produced intermediate layer in the same manner as in Example 7.

<Evaluation>

<<Measurement of Infrared Absorption Spectrum>>

The produced intermediate layer of Example 10 was subjected to a measurement of an infrared absorption spectrum in the same manner as in Example 1. As a result, the variation rate of the peak intensity ratio was 0.82. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 10 was evaluated in the same manner as in Example 1. The result is presented in Table 1-4.

Example 11

<Productions of Element and Electric Generator>

—Production of Intermediate Layer—

A silicone rubber composition was prepared by dispersing 100 parts by mass of silicone rubber (IVS4312, manufactured by Momentive Performance Materials Inc.), and 10 parts by mass of silica (Sylysia 430, manufactured by Fuji Silysia Chemical Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 300 μm.

Subsequently, the thin film was subjected to a corona discharge treatment in the same manner as in Example 5. Then, the PET film was peeled to thereby produce an intermediate layer of Example 11.

—Productions of Element and Electric Generator—

An element and an electric generator of Example 11 were produced using the produced intermediate layer in the same manner as in Example 7.

<Evaluation>

<<Measurement of Infrared Absorption Spectrum>>

The produced intermediate layer of Example 11 was subjected to a measurement of an infrared absorption spectrum in the same manner as in Example 1. As a result, the variation rate of the peak intensity ratio was 0.80. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 11 was evaluated in the same manner as in Example 1. The result is presented in Table 1-4.

Example 12

<Productions of Element and Electric Generator>

—Production of Intermediate Layer—

A silicone rubber composition was prepared by dispersing 100 parts by mass of silicone rubber (IVS4312, manufactured by Momentive Performance Materials Inc.), and 50 parts by mass of silica (HS-207, manufactured by NIPPON STEEL & SUMIKIN MATERIALS Co., Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 200 rm.

Subsequently, the thin film was subjected to a corona discharge treatment in the same manner as in Example 5. Then, the PET film was peeled to thereby produce an intermediate layer of Example 12.

—Productions of Element and Electric Generator—

An element and an electric generator of Example 12 were produced using the produced intermediate layer in the same manner as in Example 7.

<Evaluation>

<<Measurement of Infrared Absorption Spectrum>>

The produced intermediate layer of Example 12 was subjected to a measurement of an infrared absorption spectrum in the same manner as in Example 1. As a result, the variation rate of the peak intensity ratio was 0.87. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 12 was evaluated in the same manner as in Example 1. The result is presented in Table 1-4.

Example 13

<Productions of Element and Electric Generator>

—Production of Intermediate Layer—

A silicone rubber composition was prepared by dispersing 100 parts by mass of silicone rubber (IVS4312, manufactured by Momentive Performance Materials Inc.), and 10 parts by mass of diatomaceous earth (CT-C499, manufactured by SHIRAISHI CALCIUM KAISHA, LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 200 m.

Subsequently, the thin film was subjected to a corona discharge treatment in the same manner as in Example 5. Then, the PET film was peeled to thereby produce an intermediate layer of Example 13.

—Productions of Element and Electric Generator—

An element and an electric generator of Example 13 were produced using the produced intermediate layer in the same manner as in Example 7.

<Evaluation>

<<Measurement of Infrared Absorption Spectrum>>

The produced intermediate layer of Example 13 was subjected to a measurement of an infrared absorption spectrum in the same manner as in Example 1. As a result, the variation rate of the peak intensity ratio was 0.84. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 13 was evaluated in the same manner as in Example 1. The result is presented in Table 1-4.

Example 14

<Productions of Element and Electric Generator>

—Production of Intermediate Layer—

A silicone rubber composition was prepared by dispersing 100 parts by mass of silicone rubber (TSE3033, manufactured by Momentive Performance Materials Inc.), and 5 parts by mass of kaolin (Glomax LL, manufactured by TAKEHARA KAGAKU KOGYO CO., LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 150 μm.

Subsequently, the thin film was subjected to a plasma treatment (treatment conditions, a device for use: PR-500, manufactured by Yamato Scientific Co., Ltd., output: 100 W, processing time: 4 minutes, reaction atmosphere: argon 99.999%, reaction pressure: 10 Pa). Thereafter, the PET film was peeled. In the manner as described above, an intermediate layer of Example 14 was obtained.

—First Electrode and Second Electrode—

As for each of a first electrode and a second electrode, a conductive cloth Sui-80-M30 (thickness of non-woven fabric plated with copper and nickel: 35 μm) manufactured by SEIREN Co., Ltd. was provided.

—Production of Element—

The obtained intermediate layer was sandwiched with the first electrode and the second electrode, and a lead wire (C3/RV-90 0.75SQ, manufactured by Taiyo Cabletec Corporation) was attached to the assembly. The resultant was further sandwiched with cover materials (SLF-K02G, manufactured by EUROPORT, thickness of polyvinyl chloride film: 80 µm), to thereby produce an element of Example 14.

—Production of Electric Generator—

Oscilloscope (WaveAce1001, manufactured by Teledyne LeCroy Japan Corporation) was attached to the obtained element, to thereby produce an electric generator of Example 14.

<Evaluation>

<<Measurement of Infrared Absorption Spectrum>>

The produced intermediate layer of Example 14 was subjected to a measurement of an infrared absorption spectrum in the same manner as in Example 1. As a result, the variation rate of the peak intensity ratio was 0.78. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 14 was evaluated in the same manner as in Example 1. The result is presented in Table 1-4.

Example 15

<Productions of Element and Electric Generator>

—Production of Intermediate Layer, and Preparation of First Electrode and Second Electrode—

An intermediate layer was produced, and a first electrode and a second electrode were prepared in the same manner as in Example 14.

—Production of Element—

The obtained intermediate layer was sandwiched with the first electrode and the second electrode, and a lead wire (C3/RV-90 0.75SQ, manufactured by Taiyo Cabletec Corporation) was attached to the assembly. The resultant was further sandwiched with cover materials (SLF-K02G, manufactured by EUROPORT, thickness of polyvinyl chloride film: 80 µm), to thereby produce an element.

In the course of the production of the element, a space was disposed via a spacer (H10 LUMIRROR #500, manufactured by TORAY INDUSTRIES, INC., thickness of polyethylene terephthalate film: 480 µm) between the electrode and the surface of the intermediate layer at which the peak intensity ratio (1095±5 cm$^{-1}$/1025±5 cm$^{-1}$) of the infrared absorption spectrum of the intermediate layer was larger. In the manner as described above, an element of Example 15 was produced.

—Production of Electric Generator—

Oscilloscope (WaveAce1001, manufactured by Teledyne LeCroy Japan Corporation) was attached to the obtained element, to thereby produce an electric generator of Example 15.

<Evaluation>

<<Measurement of Infrared Absorption Spectrum>>

The produced intermediate layer of Example 15 was subjected to a measurement of an infrared absorption spectrum in the same manner as in Example 1. As a result, the variation rate of the peak intensity ratio was 0.78. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 15 was evaluated in the same manner as in Example 1. The result is presented in Table 1-4.

Example 16

<Productions of Element and Electric Generator>

—Production of Intermediate Layer, and Preparation of First Electrode and Second Electrode—

An intermediate layer was produced, and a first electrode and a second electrode were prepared in the same manner as in Example 14.

—Production of Element—

The obtained intermediate layer was sandwiched with the first electrode and the second electrode, and a lead wire (C3/RV-90 0.75SQ, manufactured by Taiyo Cabletec Corporation) was attached to the assembly. The resultant was further sandwiched with cover materials (SLF-K02G, manufactured by EUROPORT, thickness of polyvinyl chloride film: 80 µm), to thereby produce an element.

In the course of the production of the element, a space was disposed via a spacer (H10 LUMIRROR #500, manufactured by TORAY INDUSTRIES, INC., thickness of polyethylene terephthalate film: 480 µm) between the electrode and the surface of the intermediate layer at which the peak intensity ratio (1095±5 cm$^{-1}$/1025±5 cm$^{-1}$) of the infrared absorption spectrum of the intermediate layer was smaller. In the manner as described above, an element of Example 16 was produced.

—Production of Electric Generator—

Oscilloscope (WaveAce1001, manufactured by Teledyne LeCroy Japan Corporation) was attached to the obtained element, to thereby produce an electric generator of Example 16.

<Evaluation>

<<Measurement of Infrared Absorption Spectrum>>

The produced intermediate layer of Example 16 was subjected to a measurement of an infrared absorption spectrum in the same manner as in Example 1. As a result, the variation rate of the peak intensity ratio was 0.78. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 16 was evaluated in the same manner as in Example 1. The result is presented in Table 1-4.

Example 17

<Productions of Element and Electric Generator>

—Production of Intermediate Layer—

A silicone rubber composition was prepared by dispersing 100 parts by mass of silicone rubber (TSE3033, manufactured by Momentive Performance Materials Inc.), and 1 part by mass of kaolin (Glomax LL, manufactured by TAKEHARA KAGAKU KOGYO CO., LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 150 µm.

Subsequently, the thin film was subjected to a corona discharge treatment in the same manner as in Example 14. Then, the PET film was peeled to thereby produce an intermediate layer of Example 17.

—Productions of Element and Electric Generator—

An element and an electric generator of Example 17 were produced using the produced intermediate layer in the same manner as in Example 16.

<Evaluation>

<<Measurement of Infrared Absorption Spectrum>>

The produced intermediate layer of Example 17 was subjected to a measurement of an infrared absorption spectrum in the same manner as in Example 1. As a result, the variation rate of the peak intensity ratio was 0.73. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 17 was evaluated in the same manner as in Example 1. The result is presented in Table 1-4.

Example 18

<Productions of Element and Electric Generator>
—Production of Intermediate Layer—

A silicone rubber composition was prepared by dispersing 100 parts by mass of silicone rubber (TSE3033, manufactured by Momentive Performance Materials Inc.), and 60 parts by mass of kaolin (Glomax LL, manufactured by TAKEHARA KAGAKU KOGYO CO., LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 150 rm.

Subsequently, the thin film was subjected to a corona discharge treatment in the same manner as in Example 14. Then, the PET film was peeled to thereby produce an intermediate layer of Example 18.

—Productions of Element and Electric Generator—

An element and an electric generator of Example 18 were produced using the produced intermediate layer in the same manner as in Example 16.

<Evaluation>
<<Measurement of Infrared Absorption Spectrum>>

The produced intermediate layer of Example 18 was subjected to a measurement of an infrared absorption spectrum in the same manner as in Example 1. As a result, the variation rate of the peak intensity ratio was 0.85. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 18 was evaluated in the same manner as in Example 1. The result is presented in Table 1-4.

Example 19

<Productions of Element and Electric Generator>
—Production of Intermediate Layer—

A silicone rubber composition was prepared by dispersing 100 parts by mass of silicone rubber (TES3033, manufactured by Momentive Performance Materials Inc.), and 5 parts by mass of kaolin (Glomax LL, manufactured by TAKEHARA KAGAKU KOGYO CO., LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 20 µm. Subsequently, the thin film was subjected to a corona discharge treatment in the same manner as in Example 14. Then, the PET film was peeled to thereby produce an intermediate layer of Example 19.

—Productions of Element and Electric Generator—

An element and an electric generator of Example 19 were produced using the produced intermediate layer in the same manner as in Example 16.

<Evaluation>
<<Measurement of Infrared Absorption Spectrum>>

The produced intermediate layer of Example 19 was subjected to a measurement of an infrared absorption spectrum in the same manner as in Example 1. As a result, the variation rate of the peak intensity ratio was 0.80. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 19 was evaluated in the same manner as in Example 1. The result is presented in Table 1-4.

Example 20

<Productions of Element and Electric Generator>
—Production of Intermediate Layer—

A silicone rubber composition was prepared by dispersing 100 parts by mass of silicone rubber (TES3033, manufactured by Momentive Performance Materials Inc.), and 5 parts by mass of kaolin (Glomax LL, manufactured by TAKEHARA KAGAKU KOGYO CO., LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 300 µm.

Subsequently, the thin film was subjected to a corona discharge treatment in the same manner as in Example 14. Then, the PET film was peeled to thereby produce an intermediate layer of Example 20.

—Productions of Element and Electric Generator—

An element and an electric generator of Example 20 were produced using the produced intermediate layer in the same manner as in Example 16.

<Evaluation>
<<Measurement of Infrared Absorption Spectrum>>

The produced intermediate layer of Example 20 was subjected to a measurement of an infrared absorption spectrum in the same manner as in Example 1. As a result, the variation rate of the peak intensity ratio was 0.77. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 20 was evaluated in the same manner as in Example 1. The result is presented in Table 1-4.

Example 21

<Productions of Element and Electric Generator>
—Production of Intermediate Layer—

A first silicone rubber composition was prepared by dispersing 100 parts by mass of silicone rubber (XE14-C2042, manufactured by Momentive Performance Materials Inc.), and 5 parts by mass of kaolin (Glomax LL, manufactured by TAKEHARA KAGAKU KOGYO CO., LTD.).

Subsequently, the first silicone rubber composition was applied onto a polyimide film, and the applied silicone rubber composition was heated to cure at 120° C. for 30 minutes, to thereby form a first thin film having a thickness of 100 µm.

Subsequently, a second silicone rubber composition was prepared by dispersing 100 parts by mass of silicone rubber (XE14-C2042, manufactured by Momentive Performance Materials Inc.), and 20 parts by mass of kaolin (RC-1, manufactured by TAKEHARA KAGAKU KOGYO CO., LTD.).

Subsequently, the second silicone rubber composition was applied onto the first thin film, and the applied second silicone rubber composition was heated to cure at 120° C. for 30 minutes, to thereby form a second thin film having a thickness of 100 µm. After heating the first thin film and the second thin film at 200° C. for 5 hours, the polyimide film was peeled to thereby produce an intermediate layer of Example 21. Note that, a surface modification treatment was not performed.

—First Electrode and Second Electrode—

As for each of a first electrode and a second electrode, Sirius conductive ultrathin silicone rubber (thickness of rubber sheet: 100 µm) manufactured by Fuso Rubber Industry Co., Ltd. was provided.

—Production of Element—

The obtained intermediate layer was sandwiched with the first electrode and the second electrode, and a lead wire (C3/RV-90 0.75SQ, manufactured by Taiyo Cabletec Corporation) was attached to the assembly. The resultant was further sandwiched with cover materials (laminate film available from IRISOHYAMA Inc., thickness of polyethylene terephthalate film: 250 µm), to thereby produce an element.

In the course of the production of the element, a space was disposed via a spacer (ether-based urethane rubber FH sheet, manufactured by Fuso Rubber Industry Co., Ltd., thickness of rubber sheet: 1 mm) between the electrode and the surface of the intermediate layer at which the peak intensity ratio ($1095\pm5$ cm$^{-1}$/$1025\pm5$ cm$^{-1}$) of the infrared absorption spectrum of the intermediate layer was smaller. In the manner as described above, an element of Example 21 was produced.

—Production of Electric Generator—

Oscilloscope (WaveAce1001, manufactured by Teledyne LeCroy Japan Corporation) was attached to the obtained element, to thereby produce an electric generator of Example 21.

<Evaluation>

<<Measurement of Infrared Absorption Spectrum>>

The produced intermediate layer of Example 21 was subjected to a measurement of an infrared absorption spectrum in the same manner as in Example 1. As a result, the variation rate of the peak intensity ratio was 0.95. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 21 was evaluated in the same manner as in Example 1. The result is presented in Table 1-4.

Example 22

<Productions of Element and Electric Generator>

—Production of Intermediate Layer—

Silicone rubber (XE14-C2042, manufactured by Momentive Performance Materials Inc.) was applied onto a polyimide film, and the applied silicone rubber was heated to cure at 120° C. for 30 minutes, to thereby form a first thin film having a thickness of 100 µm.

Subsequently, a second silicone rubber composition was prepared by dispersing 100 parts by mass of silicone rubber (XE14-C2042, manufactured by Momentive Performance Materials Inc.), and 50 parts by mass of kaolin (ST-CROWN, manufactured by SHIRAISHI CALCIUM KAISHA, LTD.).

Subsequently, the second silicone rubber composition was applied onto the first thin film, and the applied second silicone rubber composition was heated to cure at 120° C. for 30 minutes, to thereby form a second thin film having a thickness of 100 µm.

After heating the first thin film and the second thin film at 200° C. for 5 hours, the polyimide film was peeled to thereby produce an intermediate layer of Example 22. Note that, a surface modification treatment was not performed.

—Productions of Element and Electric Generator—

An element and an electric generator of Example 22 were produced using the produced intermediate layer in the same manner as in Example 21.

<Evaluation>

<<Measurement of Infrared Absorption Spectrum>>

The produced intermediate layer of Example 22 was subjected to a measurement of an infrared absorption spectrum in the same manner as in Example 1. As a result, the variation rate of the peak intensity ratio was 0.94. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 22 was evaluated in the same manner as in Example 1. The result is presented in Table 1-4.

Example 23

<Productions of Element and Electric Generator>

—Production of Intermediate Layer—

A silicone rubber composition was prepared by dispersing 100 parts by mass of silicone rubber (TES3033, manufactured by Momentive Performance Materials Inc.), and 10 parts by mass of talc (Microlite manufactured by TAKEHARA KAGAKU KOGYO CO., LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 150 µm.

Subsequently, the thin film was subjected to a corona discharge treatment in the same manner as in Example 1. Then, the PET film was peeled to thereby produce an intermediate layer of Example 23.

—Productions of Element and Electric Generator—

An element and an electric generator of Example 23 were produced using the produced intermediate layer in the same manner as in Example 7.

<Evaluation>

<<Measurement of Infrared Absorption Spectrum>>

The produced intermediate layer of Example 23 was subjected to a measurement of an infrared absorption spectrum in the same manner as in Example 1. As a result, the variation rate of the peak intensity ratio was 0.82. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 23 was evaluated in the same manner as in Example 1. The result is presented in Table 1-4.

Example 24

<Productions of Element and Electric Generator>
—Production of Intermediate Layer—

Silicone rubber (XE14-C2042, manufactured by Momentive Performance Materials Inc.) was applied onto a polyethylene terephthalate (PET) film, and the applied silicone rubber was heated to cure at 120° C. for 30 minutes, to thereby form a first thin film having a thickness of 100 μm.

Subsequently, a second silicone rubber composition was prepared by dispersing 100 parts by mass of silicone rubber (XE14-C2042, manufactured by Momentive Performance Materials Inc.), and 10 parts by mass of talc (D-1000, manufactured by NIPPON TALC Co., Ltd.).

Subsequently, the second silicone rubber composition was applied onto the first thin film, and the applied second silicone rubber composition was heated to cure at 120° C. for 30 minutes, to thereby form a second thin film having a thickness of 100 μm. Subsequently, the first thin film and the second thin film were subjected to a corona discharge treatment in the same manner as in Example 1. The PET film was the peeled, to thereby produce an intermediate layer of Example 24.

—Productions of Element and Electric Generator—

An element and an electric generator of Example 24 were produced using the produced intermediate layer in the same manner as in Example 21.

<Evaluation>
<<Measurement of Infrared Absorption Spectrum>>

The produced intermediate layer of Example 24 was subjected to a measurement of an infrared absorption spectrum in the same manner as in Example 1. As a result, the variation rate of the peak intensity ratio was 0.88. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 24 was evaluated in the same manner as in Example 1. The result is presented in Table 1-4.

Example 25

<Productions of Element and Electric Generator>
—Production of Intermediate Layer—

A silicone rubber composition was prepared by dispersing 100 parts by mass of silicone rubber (TSE3033, manufactured by Momentive Performance Materials Inc.), and 10 parts by mass of wollastonite (ST-40F, manufactured by SHIRAISHI CALCIUM KAISHA, LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 m.

Subsequently, the thin film was subjected to an electron-beam irradiation treatment (treatment conditions, device for use: line-irradiation low-energy electron beam light source, manufactured by Hamamatsu Photonics K.K., radiation dose: 1 MGy, reaction atmosphere: nitrogen with oxygen partial pressure of 5,000 ppm or less). Thereafter, the PET film was peeled, to thereby produce an intermediate layer of Example 25.

—Production of Element—

The obtained intermediate layer 25 was sandwiched with electrodes (conductive cloth Sui-80-M30 manufactured by SEIREN Co., Ltd., thickness of non-woven fabric plated with copper and nickel: 35 μm), and a lead wire (C3/RV-90 0.75SQ, manufactured by Taiyo Cabletec Corporation) was attached to the assembly. The resultant was further sandwiched with cover materials (SLF-PP01G, manufactured by EUROPORT, thickness of polypropylene film: 20 μm), to thereby produce an element. In the course of the production of the element, a space was disposed via a spacer (H10 LUMIRROR #500, manufactured by TORAY INDUSTRIES, INC., thickness of polyethylene terephthalate film: 480 μm) between the electrode and the surface of the intermediate layer 25 at which the peak intensity ratio (1095±5 cm$^{-1}$/1025±5 cm$^{-1}$) of the infrared absorption spectrum of the intermediate layer was smaller. In the manner as described above, an element of Example 25 was produced.

Oscilloscope (WaveAce1001, manufactured by Teledyne LeCroy Japan Corporation) was attached to the obtained element, to thereby produce an electric generator of Example 25.

<Evaluation>
<<Measurement of Infrared Absorption Spectrum>>

The produced intermediate layer of Example 25 was subjected to a measurement of an infrared absorption spectrum in the same manner as in Example 1. As a result, the variation rate of the peak intensity ratio was 0.78. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 25 was evaluated in the same manner as in Example 1. The result is presented in Table 1-4.

Example 26

<Productions of Element and Electric Generator>
—Production of Intermediate Layer—

A silicone rubber composition was prepared by dispersing 100 parts by mass of silicone rubber (TSE3033, manufactured by Momentive Performance Materials Inc.), and 10 parts by mass of wollastonite (Wollasto JET30w, manufactured by Asada Milling Co., Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 μm.

Subsequently, the thin film was subjected to an electron-beam irradiation treatment in the same manner as in Example 25. Then, the PET film was peeled to thereby produce an intermediate layer of Example 26.

—Productions of Element and Electric Generator—

An element and an electric generator of Example 26 were produced using the produced intermediate layer in the same manner as in Example 25.

<Evaluation>
<<Measurement of Infrared Absorption Spectrum>>

The produced intermediate layer of Example 26 was subjected to a measurement of an infrared absorption spectrum in the same manner as in Example 1. As a result, the variation rate of the peak intensity ratio was 0.78. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 26 was evaluated in the same manner as in Example 1. The result is presented in Table 1-4.

Example 27

<Productions of Element and Electric Generator>
—Production of Intermediate Layer—

A silicone rubber composition was prepared by dispersing 100 parts by mass of silicone rubber (TES3033, manufactured by Momentive Performance Materials Inc.), and 20 parts by mass of mica (A-11, manufactured by YAMAGUCHI MICA CO., LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 μm.

Subsequently, the thin film was subjected to a plasma treatment in the same manner as in Example 5. Then, the PET film was peeled to thereby produce an intermediate layer of Example 27.

—Productions of Element and Electric Generator—

An element and an electric generator of Example 27 were produced using the produced intermediate layer in the same manner as in Example 25.

<Evaluation>
<<Measurement of Infrared Absorption Spectrum>>

The produced intermediate layer of Example 27 was subjected to a measurement of an infrared absorption spectrum in the same manner as in Example 1. As a result, the variation rate of the peak intensity ratio was 0.93. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 27 was evaluated in the same manner as in Example 1. The result is presented in Table 1-4.

Example 28

<Productions of Element and Electric Generator>
—Production of Intermediate Layer—

A silicone rubber composition was prepared by dispersing 100 parts by mass of silicone rubber (TSE3033, manufactured by Momentive Performance Materials Inc.), and 20 parts by mass of zeolite (SP #2300, manufactured by NITTO FUNKA KOGYO K.K.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 μm.

Subsequently, the thin film was subjected to a plasma treatment in the same manner as in Example 5. Then, the PET film was peeled to thereby produce an intermediate layer of Example 28.

—Productions of Element and Electric Generator—

An element and an electric generator of Example 28 were produced using the produced intermediate layer in the same manner as in Example 25.

<Evaluation>
<<Measurement of Infrared Absorption Spectrum>>

The produced intermediate layer of Example 28 was subjected to a measurement of an infrared absorption spectrum in the same manner as in Example 1. As a result, the variation rate of the peak intensity ratio was 0.92. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 28 was evaluated in the same manner as in Example 1. The result is presented in Table 1-4.

Example 29

<Productions of Element and Electric Generator>
—Production of Intermediate Layer—

A silicone rubber composition was prepared by dispersing 100 parts by mass of silicone rubber (TES3033, manufactured by Momentive Performance Materials Inc.), and 20 parts by mass of sericite (ST-501, manufactured by SHIRAISHI CALCIUM KAISHA, LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 μm.

Subsequently, the thin film was subjected to a plasma treatment in the same manner as in Example 5. Then, the PET film was peeled to thereby produce an intermediate layer of Example 29.

—Productions of Element and Electric Generator—

An element and an electric generator of Example 29 were produced using the produced intermediate layer in the same manner as in Example 25.

<Evaluation>
<<Measurement of Infrared Absorption Spectrum>>

The produced intermediate layer of Example 29 was subjected to a measurement of an infrared absorption spectrum in the same manner as in Example 1. As a result, the variation rate of the peak intensity ratio was 0.90. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 29 was evaluated in the same manner as in Example 1. The result is presented in Table 1-4.

Example 30

<Productions of Element and Electric Generator>
—Production of Intermediate Layer—

A silicone rubber composition was prepared by dispersing 100 parts by mass of silicone rubber (KE-1935, manufactured by Shin-Etsu Chemical Co., Ltd.), and 20 parts by mass of hollow glass beads (Sphericel 110P8, manufactured by Potters-Ballotini Co., Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 rm.

Subsequently, the thin film was subjected to a plasma treatment in the same manner as in Example 5. Then, the PET film was peeled to thereby produce an intermediate layer of Example 30.

—Productions of Element and Electric Generator—

An element and an electric generator of Example 30 were produced using the produced intermediate layer in the same manner as in Example 25.

<Evaluation>

<<Measurement of Infrared Absorption Spectrum>>

The produced intermediate layer of Example 30 was subjected to a measurement of an infrared absorption spectrum in the same manner as in Example 1. As a result, the variation rate of the peak intensity ratio was 0.90. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 30 was evaluated in the same manner as in Example 1. The result is presented in Table 1-4.

Example 31

<Productions of Element and Electric Generator>

—Production of Intermediate Layer—

A silicone rubber composition was prepared by dispersing 100 parts by mass of silicone rubber (KE-1935, manufactured by Shin-Etsu Chemical Co., Ltd.), and 20 parts by mass of acryl particles (FH-S005, manufactured by TOYOBO CO., LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 μm.

Subsequently, the thin film was subjected to a plasma treatment in the same manner as in Example 5. Then, the PET film was peeled to thereby produce an intermediate layer of Example 31.

—Productions of Element and Electric Generator—

An element and an electric generator of Example 31 were produced using the produced intermediate layer in the same manner as in Example 25.

<Evaluation>

<<Measurement of Infrared Absorption Spectrum>>

The produced intermediate layer of Example 31 was subjected to a measurement of an infrared absorption spectrum in the same manner as in Example 1. As a result, the variation rate of the peak intensity ratio was 0.95. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 31 was evaluated in the same manner as in Example 1. The result is presented in Table 2-4.

Example 32

<Productions of Element and Electric Generator>

—Production of Intermediate Layer—

A silicone rubber composition was prepared by dispersing 100 parts by mass of silicone rubber (KE-1935, manufactured by Shin-Etsu Chemical Co., Ltd.), and 20 parts by mass of polystyrene particles (19520-500, manufactured by Techno Chemical Corporation).

Subsequently, the silicone rubber composition was applied onto a polyethylene terephthalate (PET) film, and the applied silicone rubber composition was heated to cure at 120° C. for 30 minutes, to thereby form a thin film having a thickness of 100 μm.

Subsequently, the thin film was subjected to a plasma treatment in the same manner as in Example 5. Then, the PET film was peeled to thereby produce an intermediate layer of Example 32.

—Productions of Element and Electric Generator—

An element and an electric generator of Example 32 were produced using the produced intermediate layer in the same manner as in Example 25.

<Evaluation>

<<Measurement of Infrared Absorption Spectrum>>

The produced intermediate layer of Example 32 was subjected to a measurement of an infrared absorption spectrum in the same manner as in Example 1. As a result, the variation rate of the peak intensity ratio was 0.95. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 32 was evaluated in the same manner as in Example 1. The result is presented in Table 2-4.

Example 33

<Productions of Element and Electric Generator>

—Production of Intermediate Layer—A silicone rubber composition was prepared by dispersing 100 parts by mass of silicone rubber (XE14-C2042, manufactured by Momentive Performance Materials Inc.), and 50 parts by mass of silica (HS-207, manufactured by NIPPON STEEL & SUMIKIN MATERIALS Co., Ltd.).

Subsequently, the silicone rubber composition was applied onto a polyethylene terephthalate (PET) film, and the applied silicone rubber composition was heated to cure at 120° C. for 30 minutes, to thereby form a first thin film having a thickness of 50 μm.

Subsequently, silicone rubber (XE14-C2042, manufactured by Momentive Performance Materials Inc.) was applied onto the first thin film, and the applied silicone rubber was heated to cure at 120° C. for 30 minutes, to thereby form a second thin film having a thickness of 50 μm.

Subsequently, the first thin film and the second thin film were subjected to an electron-beam irradiation treatment in the same manner as in Example 25. Then, the PET film was peeled to thereby produce an intermediate layer of Example 33.

—First Electrode and Second Electrode—

As for a first electrode, AL-PET 20-100 (thickness of aluminium foil: 20 μm, thickness of polyethylene terephthalate film: 100 μm (cover material)) manufactured by PANAC CO., LTD. was provided. As for a second electrode, Panabrid 35-50 (thickness of copper foil: 35 μm, thickness of polyethylene terephthalate film: 50 m (cover material)) manufactured by PANAC CO., LTD. was provided.

—Production of Element—

The obtained intermediate layer was sandwiched with the first electrode and the second electrode, and a lead wire (C3/RV-90 0.75SQ, manufactured by Taiyo Cabletec Corporation) was attached to the assembly, to thereby produce an element.

In the course of the production of the element, a space was disposed via a spacer (H10 LUMIRROR #500, manufactured by TORAY INDUSTRIES, INC., thickness of polyethylene terephthalate film: 480 μm) between the electrode and the surface of the intermediate layer at which the peak intensity ratio (1095±5 cm$^{-1}$/1025±5 cm$^{-1}$) of the infrared absorption spectrum of the intermediate layer was smaller. In the manner as described above, an element of Example 33 was produced.

—Production of Electric Generator—

Oscilloscope (WaveAce1001, manufactured by Teledyne LeCroy Japan Corporation) was attached to the obtained element, to thereby produce an electric generator of Example 33.

<Evaluation>

<<Measurement of Infrared Absorption Spectrum>>

The produced intermediate layer of Example 33 was subjected to a measurement of an infrared absorption spectrum in the same manner as in Example 1. As a result, the variation rate of the peak intensity ratio was 0.81. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 33 was evaluated in the same manner as in Example 1. The result is presented in Table 2-4.

Example 34

<Productions of Element and Electric Generator>
—Production of Intermediate Layer—

A silicone rubber composition was prepared by dispersing 100 parts by mass of silicone rubber (XE14-C2042, manufactured by Momentive Performance Materials Inc.), and 50 parts by mass of wollastonite (Wollasto JET30w, manufactured by Asada Milling Co., Ltd.).

Subsequently, the silicone rubber composition was applied onto a polyethylene terephthalate (PET) film, and the applied silicone rubber composition was heated to cure at 120° C. for 30 minutes, to thereby form a first thin film having a thickness of 50 µm.

Subsequently, silicone rubber (XE14-C2042, manufactured by Momentive Performance Materials Inc.) was applied onto the first thin film, and the applied silicone rubber was heated to cure at 120° C. for 30 minutes, to thereby form a second thin film having a thickness of 50 µm.

Subsequently, the first thin film and the second thin film were subjected to an electron-beam irradiation treatment in the same manner as in Example 25. Then, the PET film was peeled to thereby produce an intermediate layer of Example 34.

—Productions of Element and Electric Generator—

An element and an electric generator of Example 34 were produced using the produced intermediate layer in the same manner as in Example 33.

<Evaluation>

<<Measurement of Infrared Absorption Spectrum>>

The produced intermediate layer of Example 34 was subjected to a measurement of an infrared absorption spectrum in the same manner as in Example 1. As a result, the variation rate of the peak intensity ratio was 0.81. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 34 was evaluated in the same manner as in Example 1. The result is presented in Table 2-4.

Example 35

<Productions of Element and Electric Generator>
—Production of Intermediate Layer—

A silicone rubber composition was prepared by dispersing 100 parts by mass of silicone rubber (KE-1935, manufactured by Shin-Etsu Chemical Co., Ltd.), 20 parts by mass of a silicone resin powder (Tospearl 120, manufactured by Momentive Performance Materials Inc.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 µm.

Subsequently, the thin film was subjected to a plasma treatment in the same manner as in Example 5. Then, the PET film was peeled to thereby produce an intermediate layer of Example 35.

—Productions of Element and Electric Generator—

An element and an electric generator of Example 35 were produced using the produced intermediate layer in the same manner as in Example 33.

<Evaluation>

<<Measurement of Infrared Absorption Spectrum>>

The produced intermediate layer of Example 35 was subjected to a measurement of an infrared absorption spectrum in the same manner as in Example 1. As a result, the variation rate of the peak intensity ratio was 0.83. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 35 was evaluated in the same manner as in Example 1. The result is presented in Table 2-4.

Example 36

<Productions of Element and Electric Generator>
—Production of Intermediate Layer—

A silicone rubber composition was prepared by dispersing 100 parts by mass of silicone rubber (KE-1935, manufactured by Shin-Etsu Chemical Co., Ltd.), and 20 parts by mass of a silicone rubber powder (EP-2600, manufactured by Dow Corning Toray Co., Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 µm.

Subsequently, the thin film was subjected to a plasma treatment in the same manner as in Example 5. Then, the PET film was peeled, to thereby produce an intermediate layer of Example 36.

—Productions of Element and Electric Generator—

An element and an electric generator of Example 36 were produced using the produced intermediate layer in the same manner as in Example 33.

<Evaluation>

<<Measurement of Infrared Absorption Spectrum>>

The produced intermediate layer of Example 36 was subjected to a measurement of an infrared absorption spectrum in the same manner as in Example 1. As a result, the variation rate of the peak intensity ratio was 0.83. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 36 was evaluated in the same manner as in Example 1. The result is presented in Table 2-4.

Example 37

<Productions of Element and Electric Generator>
—Production of Intermediate Layer—

A silicone rubber composition was prepared by dispersing 100 parts by mass of silicone rubber (KE-1935, manufactured by Shin-Etsu Chemical Co., Ltd.), and 20 parts by mass of a silicone composite powder (KMP-605, manufactured by Shin-Etsu Chemical Co., Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 μm.

Subsequently, the thin film was subjected to a plasma treatment in the same manner as in Example 5. Then, the PET film was peeled to thereby produce an intermediate layer of Example 37.

—Productions of Element and Electric Generator—

An element and an electric generator of Example 37 were produced using the produced intermediate layer in the same manner as in Example 33.

<Evaluation>
<<Measurement of Infrared Absorption Spectrum>>

The produced intermediate layer of Example 37 was subjected to a measurement of an infrared absorption spectrum in the same manner as in Example 1. As a result, the variation rate of the peak intensity ratio was 0.82. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 37 was evaluated in the same manner as in Example 1. The result is presented in Table 2-4.

Example 38

<Productions of Element and Electric Generator>
—Production of Intermediate Layer—

A silicone rubber composition was prepared by dispersing 100 parts by mass of silicone rubber (KE-1935, manufactured by Shin-Etsu Chemical Co., Ltd.), and 10 parts by mass of silica-acryl composite particles (Soliostar RA, manufactured by NIPPON SHOKUBAI CO., LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 μm.

Subsequently, the thin film was subjected to an electron-beam irradiation treatment in the same manner as in Example 25. Then, the PET film was peeled to thereby produce an intermediate layer of Example 38.

—Productions of Element and Electric Generator—

An element and an electric generator of Example 38 were produced using the produced intermediate layer in the same manner as in Example 33.

<Evaluation>
<<Measurement of Infrared Absorption Spectrum>>

The produced intermediate layer of Example 38 was subjected to a measurement of an infrared absorption spectrum in the same manner as in Example 1. As a result, the variation rate of the peak intensity ratio was 0.75. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 38 was evaluated in the same manner as in Example 1. The result is presented in Table 2-4.

Example 39

<Productions of Element and Electric Generator>
—Production of Intermediate Layer—

A silicone rubber composition was prepared by dispersing 100 parts by mass of silicone rubber (KE-1935, manufactured by Shin-Etsu Chemical Co., Ltd.), and 1 part of silsesquioxane (PPS-octamethyl substituent 526835, manufactured by Sigma-Aldrich Co., LLC.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 μm.

Subsequently, the thin film was subjected to an electron-beam irradiation treatment in the same manner as in Example 25. Then, the PET film was peeled to thereby produce an intermediate layer of Example 39.

—Productions of Element and Electric Generator—

An element and an electric generator of Example 39 were produced using the produced intermediate layer in the same manner as in Example 33.

<Evaluation>
<<Measurement of Infrared Absorption Spectrum>>

The produced intermediate layer of Example 39 was subjected to a measurement of an infrared absorption spectrum in the same manner as in Example 1. As a result, the variation rate of the peak intensity ratio was 0.72. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 39 was evaluated in the same manner as in Example 1. The result is presented in Table 2-4.

Example 40

<Productions of Element and Electric Generator>
—Production of Intermediate Layer—

A silicone rubber composition was prepared by dispersing 100 parts by mass of silicone rubber (KE-1935, manufactured by Shin-Etsu Chemical Co., Ltd.), and 1 part by mass of silsesquioxane (PPS-octaphenyl substituent 526851, manufactured by Sigma-Aldrich Co., LLC.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 rm.

Subsequently, the thin film was subjected to an electron-beam irradiation treatment in the same manner as in Example 25. Then, the PET film was peeled to thereby produce an intermediate layer of Example 40.

—Productions of Element and Electric Generator—

An element and an electric generator of Example 40 were produced using the produced intermediate layer in the same manner as in Example 33.

<Evaluation>

<<Measurement of Infrared Absorption Spectrum>>

The produced intermediate layer of Example 40 was subjected to a measurement of an infrared absorption spectrum in the same manner as in Example 1. As a result, the variation rate of the peak intensity ratio was 0.72. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 40 was evaluated in the same manner as in Example 1. The result is presented in Table 2-4.

Comparative Example 1

<Productions of Element and Electric Generator>

—Production of Intermediate Layer—

Silicone rubber (IVS4312, manufactured by Momentive Performance Materials Inc.) was applied onto a polyethylene terephthalate (PET) film, and the applied silicone rubber was heated to cure at 120° C. for 30 minutes, to thereby form a thin film having a thickness of 100 μm. Note that, a surface modification treatment was not performed. In the manner as described, an intermediate layer of Comparative Example 1 was produced.

—Productions of Element and Electric Generator—

An element and an electric generator of Comparative Example 1 were produced using the produced intermediate layer in the same manner as in Example 1.

<Evaluation>

<<Measurement of Infrared Absorption Spectrum>>

The produced intermediate layer of Comparative Example 1 was subjected to a measurement of an infrared absorption spectrum in the same manner as in Example 1. As a result, the variation rate of the peak intensity ratio was 0.99. It was confirmed from the obtained variation rate that a state of a Si—O—Si bond of the silicone rubber was the same throughout the intermediate layer.

<<Evaluation of Electricity Generation Performance>>

The electricity generation performance of the produced electric generator of Comparative Example 1 was evaluated in the same manner as in Example 1. The result is presented in Table 2-4.

Comparative Example 2

<Productions of Element and Electric Generator>

—Production of Intermediate Layer—

Ethylene propylene diene rubber (EPDM rubber FH ultrathin sheet, manufactured by Fuso Rubber Industry Co., Ltd., thickness of rubber sheet: 200 μm) was subjected to a corona discharge treatment in the same manner as in Example 1, to thereby produce an intermediate layer of Comparative Example 2.

—Productions of Element and Electric Generator—

An element and an electric generator of Comparative Example 2 were produced using the produced intermediate layer in the same manner as in Example 1.

<<Evaluation of Electricity Generation Performance>>

The electricity generation performance of the produced electric generator of Comparative Example 2 was evaluated in the same manner as in Example 1. The result is presented in Table 2-4.

Comparative Example 3

<Productions of Element and Electric Generator>

—Production of Intermediate Layer—

Styrene butadiene rubber (SBR rubber FH ultrathin sheet, manufactured by Fuso Rubber Industry Co., Ltd., thickness of rubber sheet: 200 μm) was subjected to a corona discharge treatment in the same manner as in Example 1, to thereby produce an intermediate layer of Comparative Example 3.

—Productions of Element and Electric Generator—

An element and an electric generator of Comparative Example 3 were produced using the produced intermediate layer in the same manner as in Example 1.

<<Evaluation of Electricity Generation Performance>>

The electricity generation performance of the produced electric generator of Comparative Example 3 was evaluated in the same manner as in Example 1. The result is presented in Table 2-4.

Comparative Example 4

<Productions of Element and Electric Generator>

—Production of Intermediate Layer—

A urethane rubber composition was prepared by dispersing 100 parts by mass of urethane rubber (ADAPT 60L, manufactured by NISSIN RESIN Co., Ltd.), 50 parts by mass of kaolin (Glomax LL, manufactured by TAKEHARA KAGAKU KOGYO CO., LTD.).

Subsequently, the urethane rubber composition was applied onto a polyethylene terephthalate (PET) film, and the applied urethane rubber composition was heated to cure at 60° C. for 4 hours, to thereby form a thin film having a thickness of 100 μm. Subsequently, the thin film was subjected to a corona discharge treatment in the same manner as in Example 1. Then, the PET film was peeled to thereby produce an intermediate layer of Comparative Example 4.

—Productions of Element and Electric Generator—

An element and an electric generator of Comparative Example 4 were produced using the produced intermediate layer in the same manner as in Example 1.

<<Evaluation of Electricity Generation Performance>>

The electricity generation performance of the produced electric generator of Comparative Example 4 was evaluated in the same manner as in Example 1. The result is presented in Table 2-4.

Comparative Example 5

<Productions of Element and Electric Generator>

—Production of Element—

A lead wire (C3/RV-90 0.75SQ, manufactured by Taiyo Cabletec Corporation) was attached to a polyvinylidene fluoride piezo film (manufactured by Tokyo Sensor Co., Ltd., thickness of PVDF: 110 μm, thickness of silver electrode: 6 μm). The resultant was sandwiched with cover materials (H10 LUMIRROR #100, manufactured by TORAY INDUSTRIES, INC., thickness of polyethylene terephthalate: 100 μm), to thereby produce an element of Comparative Example 5.

—Production of Electric Generator—

Oscilloscope (WaveAce1001, manufactured by Teledyne LeCroy Japan Corporation) was attached to the obtained element of Comparative Example 5, to thereby produce an electric generator of Comparative Example 5.

<<Evaluation of Electricity Generation Performance>>

The electricity generation performance of the produced electric generator of Comparative Example 5 was evaluated in the same manner as in Example 1. The result is presented in Table 2-4.

Comparative Example 6

<Productions of Element and Electric Generator>
—Production of Electret Derivative—

A fluororesin solution (CYTOP CTL-809A, manufactured by ASAHI GLASS CO., LTD.) was applied onto a copper plate (C1100, available from Yamanoto Techno Inc., thickness: 100 μm) by spin coating. After leaving the resultant to stand at room temperature for 30 minutes, the fluororesin solution was heated (precured) at 50° C. for 1 hour, followed by heating (postcuring) at 300° C. for 1 hour, to thereby form a thin film having a thickness of 10 rm.

Subsequently, the thin film was an electret treatment (corona discharge treatment) (treatment conditions, device for use: HAR-20R5, manufactured by Matsusada Precision Inc., corona needle voltage: −10 kV, grid voltage: −1 kV, heating temperature: 100° C.), to thereby obtain an electret derivative.

—First Electrode and Second Electrode—

As for a first electrode, Panabrid 35-50 (thickness of copper foil: 35 μm, thickness of polyethylene terephthalate film: 50 μm (cover material)) manufactured by PANAC CO., LTD. was provided. As for a second electrode, a copper plate (C1100, available from Yamanoto Techno Inc., thickness: 100 μm) was provided.

—Production of Element—

The obtained electret derivative was sandwiched with the first electrode and the second electrode, and a lead wire (C3/RV-90 0.75SQ, manufactured by Taiyo Cabletec Corporation) was attached to the assembly. The resultant was further sandwiched with cover materials (H10 LUMIRROR #100, manufactured by TORAY INDUSTRIES, INC., thickness of polyethylene terephthalate film: 100 μm), to thereby produce an element of Comparative Example 6.

—Production of Electric Generator—

Oscilloscope (WaveAce1001, manufactured by Teledyne LeCroy Japan Corporation) was attached to the obtained element, to thereby produce an electric generator of Comparative Example 6.

<<Evaluation of Electricity Generation Performance>>

The electricity generation performance of the produced electric generator of Comparative Example 6 was evaluated in the same manner as in Example 1. The result is presented in Table 2-4.

Example 41

<Productions of Element and Electric Generator>
—Production of Intermediate Layer—

A silicone rubber composition was prepared by dispersing 100 parts by mass of silicone rubber (TSE3033, manufactured by Momentive Performance Materials Inc.), 20 parts by mass of silica (Sylysia 430, manufactured by Fuji Silysia Chemical Ltd.), and 10 parts by mass of barium titanate (208108, manufactured by Sigma-Aldrich Co., LLC.).

Subsequently, the silicone rubber composition was applied onto a polyethylene terephthalate (PET) film, and the applied silicone rubber composition was heated to cure at 120° C. for 30 minutes, to thereby form a thin film having a thickness of 50 μm. Subsequently, the thin film was subjected to a plasma treatment (treatment conditions, a device for use: PR-500, manufactured by Yamato Scientific Co., Ltd., output: 100 W, processing time: 4 minutes, reaction atmosphere: argon 99.999%, reaction pressure: 10 Pa). Then, the PET film was peeled, to thereby produce an intermediate layer of Example 41.

—First Electrode and Second Electrode—

As for each of a first electrode and a second electrode, Sirius-conductive ultrathin silicone rubber (thickness of rubber sheet: 100 μm) manufactured by Fuso Rubber Industry Co., Ltd. was provided.

—Production of Element—

The obtained intermediate layer was sandwiched with the first electrode and the second electrode, and a lead wire (C3/RV-90 0.75SQ, manufactured by Taiyo Cabletec Corporation) was attached to the assembly. The resultant was further sandwiched with cover materials (laminate film available from IRISOHYAMA Inc., thickness of polyethylene terephthalate film: 250 μm), to thereby produce an element.

In the course of the production of the element, a space was disposed via a spacer (ether-based urethane rubber FH sheet, manufactured by Fuso Rubber Industry Co., Ltd., thickness of rubber sheet: 1 mm) between the electrode and the surface of the intermediate layer at which the peak intensity ratio ($1095\pm5$ $cm^{-1}$/$1025\pm5$ $cm^{-1}$) of the infrared absorption spectrum of the intermediate layer was smaller. In the manner as described above, an element of Example 41 was produced.

—Production of Electric Generator—

Oscilloscope (WaveAce1001, manufactured by Teledyne LeCroy Japan Corporation) was attached to the obtained element, to thereby produce an electric generator of Example 41.

<Evaluation>
<<Measurement of Infrared Absorption Spectrum>>

The produced intermediate layer of Example 41 was subjected to a measurement of an infrared absorption spectrum in the same manner as in Example 1. As a result, the variation rate of the peak intensity ratio was 0.84. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 41 was evaluated in the same manner as in Example 1. The result is presented in Table 3-4.

Example 42

<Productions of Element and Electric Generator>
—Production of Intermediate Layer—

A silicone rubber composition was prepared by dispersing 100 parts by mass of silicone rubber (TSE3033, manufactured by Momentive Performance Materials Inc.), 20 parts by mass of silica (Sylysia 430, manufactured by Fuji Silysia Chemical Ltd.), and 5 parts by mass of titanium oxide (CR-90, manufactured by ISHIHARA SANGYO KAISHA, LTD.).

Subsequently, the silicone rubber composition was applied onto a polyethylene terephthalate (PET) film, and the applied silicone rubber composition was heated to cure at 120° C. for 30 minutes, to thereby form a thin film having a thickness of 50 μm.

Subsequently, the thin film was subjected to a plasma treatment in the same manner as in Example 41. Then, the PET film was peeled to thereby produce an intermediate layer of Example 42.

—Productions of Element and Electric Generator—

An element and an electric generator of Example 42 were produced using the produced intermediate layer in the same manner as in Example 41.

<Evaluation>

<<Measurement of Infrared Absorption Spectrum>>

The produced intermediate layer of Example 42 was subjected to a measurement of an infrared absorption spectrum in the same manner as in Example 1. As a result, the variation rate of the peak intensity ratio was 0.82. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 42 was evaluated in the same manner as in Example 1. The result is presented in Table 3-4.

Example 43

<Productions of Element and Electric Generator>

—Production of Intermediate Layer—

A silicone rubber composition was prepared by dispersing 100 parts by mass of silicone rubber (TES3033, manufactured by Momentive Performance Materials Inc.), 20 parts by mass of silica (Sylysia 430, manufactured by Fuji Silysia Chemical Ltd.), and 5 parts by mass of iron oxide (Todacolor 100ED, manufactured by TODA KOGYO CORP.).

Subsequently, the silicone rubber composition was applied onto a polyethylene terephthalate (PET) film, and the applied silicone rubber composition was heated to cure at 120° C. for 30 minutes, to thereby form a thin film having a thickness of 50 μm. Subsequently, the thin film was subjected to a plasma treatment in the same manner as in Example 41. Then, the PET film was peeled to thereby produce an intermediate layer of Example 43.

—Productions of Element and Electric Generator—

An element and an electric generator of Example 43 were produced using the produced intermediate layer in the same manner as in Example 41.

<Evaluation>

<<Measurement of Infrared Absorption Spectrum>>

The produced intermediate layer of Example 43 was subjected to a measurement of an infrared absorption spectrum in the same manner as in Example 1. As a result, the variation rate of the peak intensity ratio was 0.82. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 43 was evaluated in the same manner as in Example 1. The result is presented in Table 3-4.

Example 44

<Productions of Element and Electric Generator>

—Production of Intermediate Layer—

A silicone rubber composition was prepared by dispersing 100 parts by mass of silicone rubber (TES3033, manufactured by Momentive Performance Materials Inc.), 10 parts by mass of kaolin (Glomax LL, manufactured by TAKEHARA KAGAKU KOGYO CO., LTD.), and 0.1 parts by mass of carbon nanofiber (VGCF-H, manufactured by SHOWA DENKO K.K.).

Subsequently, the silicone rubber composition was applied onto a polyethylene terephthalate (PET) film, and the applied silicone rubber composition was heated to cure at 120° C. for 30 minutes, to thereby form a thin film having a thickness of 50 μm. Subsequently, the thin film was subjected to a plasma treatment in the same manner as in Example 41. Then, the PET film was peeled to thereby produce an intermediate layer of Example 44.

—Productions of Element and Electric Generator—

An element and an electric generator of Example 44 were produced using the produced intermediate layer in the same manner as in Example 41.

<Evaluation>

<<Measurement of Infrared Absorption Spectrum>>

The produced intermediate layer of Example 44 was subjected to a measurement of an infrared absorption spectrum in the same manner as in Example 1. As a result, the variation rate of the peak intensity ratio was 0.80. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 44 was evaluated in the same manner as in Example 1. The result is presented in Table 3-4.

Example 45

<Productions of Element and Electric Generator>

—Production of Intermediate Layer—

A silicone rubber composition was prepared by dispersing 100 parts by mass of silicone rubber (TES3033, manufactured by Momentive Performance Materials Inc.), 10 parts by mass of kaolin (Glomax LL, manufactured by TAKEHARA KAGAKU KOGYO CO., LTD.), and 0.1 parts by mass of fullerene (nanom purple ST, manufactured by Frontier Carbon Corporation).

Subsequently, the silicone rubber composition was applied onto a polyethylene terephthalate (PET) film, and the applied silicone rubber composition was heated to cure at 120° C. for 30 minutes, to thereby form a thin film having a thickness of 50 μm. Subsequently, the thin film was subjected to a plasma treatment in the same manner as in Example 41. Then, the PET film was peeled to thereby produce an intermediate layer of Example 45.

—Productions of Element and Electric Generator—

An element and an electric generator of Example 45 were produced using the produced intermediate layer in the same manner as in Example 41.

<Evaluation>

<<Measurement of Infrared Absorption Spectrum>>

The produced intermediate layer of Example 45 was subjected to a measurement of an infrared absorption spectrum in the same manner as in Example 1. As a result, the variation rate of the peak intensity ratio was 0.80. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 45 was evaluated in the same manner as in Example 1. The result is presented in Table 3-4.

Example 46

\<Productions of Element and Electric Generator>
—Production of Intermediate Layer—

A silicone rubber composition was prepared by dispersing 100 parts by mass of silicone rubber (TES3033, manufactured by Momentive Performance Materials Inc.), 20 parts by mass of silica (Sylysia 430, manufactured by Fuji Silysia Chemical Ltd.), and 10 parts by mass of a silicone rubber powder (EP-2600, manufactured by Dow Corning Toray Co., Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 50 µm. Subsequently, the thin film was subjected to a plasma treatment in the same manner as in Example 41. Then, the PET film was peeled to thereby produce an intermediate layer of Example 46.

—Productions of Element and Electric Generator—

An element and an electric generator of Example 46 were produced using the produced intermediate layer in the same manner as in Example 41.

\<Evaluation>
\<\<Measurement of Infrared Absorption Spectrum>>

The produced intermediate layer of Example 46 was subjected to a measurement of an infrared absorption spectrum in the same manner as in Example 1. As a result, the variation rate of the peak intensity ratio was 0.82. It was confirmed from the obtained variation rate that a region where a state of a Si—O—Si bond of the silicone rubber was different was present in the intermediate layer.

\<\<Evaluation of Electricity Generation Performance>>

The electricity generation performance of the produced electric generator of Example 46 was evaluated in the same manner as in Example 1. The result is presented in Table 3-4.

Example 47

\<Productions of Element and Electric Generator>
—Production of Intermediate Layer—

A silicone rubber composition was prepared by dispersing 100 parts by mass of silicone rubber (TES3033, manufactured by Momentive Performance Materials Inc.), 10 parts by mass of kaolin (Glomax LL, manufactured by TAKEHARA KAGAKU KOGYO CO., LTD.), and 1 part by mass of silsesquioxane (PPS-octamethyl substituent 526835, manufactured by Sigma-Aldrich Co., LLC.).

Subsequently, the silicone rubber composition was applied onto a polyethylene terephthalate (PET) film, and the applied silicone rubber composition was heated to cure at 120° C. for 30 minutes, to thereby form a thin film having a thickness of 50 µm. Subsequently, the thin film was subjected to a plasma treatment in the same manner as in Example 41. Then, the PET film was peeled to thereby produce an intermediate layer of Example 47.

—Productions of Element and Electric Generator—

An element and an electric generator of Example 47 were produced using the produced intermediate layer in the same manner as in Example 41.

\<Evaluation>
\<\<Measurement of Infrared Absorption Spectrum>>

The produced intermediate layer of Example 47 was subjected to a measurement of an infrared absorption spectrum in the same manner as in Example 1. As a result, the variation rate of the peak intensity ratio was 0.81. It was confirmed from the obtained variation rate that a region where a state of a Si—O—Si bond of the silicone rubber was different was present in the intermediate layer.

\<\<Evaluation of Electricity Generation Performance>>

The electricity generation performance of the produced electric generator of Example 47 was evaluated in the same manner as in Example 1. The result is presented in Table 3-4.

Example 48

\<Productions of Element and Electric Generator>
—Production of Intermediate Layer—

A silicone rubber composition was prepared by dispersing 100 parts by mass of silicone rubber (IVS4312, manufactured by Momentive Performance Materials Inc.), and 5 parts by mass of silica (Sylysia 430, manufactured by Fuji Silysia Chemical Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 µm.

Subsequently, the thin film was subjected to a UV-ray irradiation treatment (treatment conditions, device for use: UV radiation lamp VL-215.C manufactured by Vilber Lourmat, wavelength: 254 nm, cumulative radiation: 300 J/cm$^2$, reaction atmosphere: nitrogen with oxygen partial pressure of 5,000 ppm or less). Then, the PET film was peeled, to thereby produce an intermediate layer of Example 48.

—Productions of Element and Electric Generator—

An element and an electric generator of Example 48 were produced using the produced intermediate layer in the same manner as in Example 1.

\<Evaluation>
\<\<Measurement of Infrared Absorption Spectrum>>

The produced intermediate layer of Example 48 was subjected to a measurement of an infrared absorption spectrum in the same manner as in Example 1. As a result, the variation rate of the peak intensity ratio was 0.93. It was confirmed from the obtained variation rate that a region where a state of a Si—O—Si bond of the silicone rubber was different was present in the intermediate layer.

\<\<Evaluation of Electricity Generation Performance>>

The electricity generation performance of the produced electric generator of Example 48 was evaluated in the same manner as in Example 1. The result is presented in Table 3-4.

Example 49

\<Productions of Element and Electric Generator>
—Production of Intermediate Layer—

A silicone rubber composition was prepared by dispersing 100 parts by mass of silicone rubber (IVS4312, manufactured by Momentive Performance Materials Inc.), and 0.5 parts by mass of silica (Sylysia 430, manufactured by Fuji Silysia Chemical Ltd.).

Subsequently, the silicone rubber composition was applied onto a polyethylene terephthalate (PET) film, and the applied silicone rubber composition was heated to cure at 120° C. for 30 minutes, to thereby form a thin film having a thickness of 100 µm. Note that, a surface modification treatment was not performed. The PET film was peeled, to thereby produce an intermediate layer of Example 49.

—Productions of Element and Electric Generator—

An element and an electric generator of Example 49 were produced using the produced intermediate layer in the same manner as in Example 1.

\<Evaluation>
\<\<Measurement of Infrared Absorption Spectrum>>

The produced intermediate layer of Example 49 was subjected to a measurement of an infrared absorption spectrum in the same manner as in Example 1. As a result, the variation rate of the peak intensity ratio was 0.98. It was confirmed from the obtained variation rate that a region where a state of a Si—O—Si bond of the silicone rubber was different was present in the intermediate layer.

<<Evaluation of Electricity Generation Performance>>

The electricity generation performance of the produced electric generator of Example 49 was evaluated in the same manner as in Example 1. The result is presented in Table 3-4.

Subsequently, the compositions and physical properties of the intermediate layer, first and second electrodes, spacer, and cover material of Examples 1 to 30 are summarized in Tables 1-1 to 1-3. The compositions and physical properties of the intermediate layer, first and second electrodes, spacer, and cover material of Examples 31 to 40 and Comparative Examples 1 to 6 are summarized in Tables 2-1 to 2-3. The compositions and physical properties of the intermediate layer, first and second electrodes, spacer, and cover material of Examples 41 to 49 are summarized in Tables 3-1 to 3-3.

TABLE 1-1

| | | Intermediate layer | | |
|---|---|---|---|---|
| | Rubber | | Filler | |
| | Type | Amount (mass parts) | Type | Amount (mass parts) |
| Ex. 1 | Silicone rubber IVS4312 | — | None | |
| Ex. 2 | Silicone rubber KE-1935 | — | None | |
| Ex. 3 | Silicone rubber IVS4312 | 100 | Barium titanate | 50 |
| Ex. 4 | Silicone rubber IVS4312 | 100 | Strontium titanate | 50 |
| Ex. 5 | Silicone rubber IVS4312 | 100 | Silica Sylysia 430 | 10 |
| Ex. 6 | Silicons rubber IVS4312 | 100 | Silica Sylysia 430 | 10 |
| Ex. 7 | Silicone rubber IVS4312 | 100 | Silica Sylysia 430 | 10 |
| Ex. 8 | Silicons rubber IVS4312 | 100 | Silica Sylysia 430 | 50 |
| Ex. 9 | Silicons rubber IVS4312 | 100 | Silica Sylysia 430 | 60 |
| Ex. 10 | Silicone rubber IVS4312 | 100 | Silica Sylysia 430 | 10 |
| Ex. 11 | Silicone rubber IVS4312 | 100 | Silica Sylysia 430 | 10 |
| Ex. 12 | Silicone rubber IVS4312 | 100 | Silica HS-207 | 50 |
| Ex. 13 | Silicone rubber IVS4312 | 100 | Diatomaceour earth CT-C499 | 10 |
| Ex. 14 | Silicone rubber TSE3033 | 100 | Kaolin Glomax LL | 5 |
| Ex. 15 | Silicone rubber TSE3033 | 100 | Kaolin Glomax LL | 5 |
| Ex. 16 | Silicone rubber TSE3033 | 100 | Kaolin Glomax LL | 5 |
| Ex. 17 | Silicone rubber TSE3033 | 100 | Kaolin Glomax LL | 1 |
| Ex. 18 | Silicone rubber TSE3033 | 100 | Kaolin Glomax LL | 60 |
| Ex. 19 | Silicone rubber TSE3033 | 100 | Kaolin Glomax LL | 5 |
| Ex. 20 | Silicone rubber TSE3033 | 100 | Kaolin Glomax LL | 5 |
| Ex. 21 | Top: Silicone rubber XE14-C2042 | 100 | Kaolin RC-1 | 20 |
| | Bottom: Silicone rubber XE14-C2042 | 100 | Kaolin Glomax LL | 5 |
| Ex. 22 | Top: Silicone rubber XE14-C2042 | 100 | Kaolin ST-CROWN | 50 |
| | Bottom: Silicone rubber XE14-C2042 | — | None | |
| Ex. 23 | Silicone rubber TSE3033 | 100 | Talc Microlite | 10 |
| Ex. 24 | Top: Silicone rubber XE14-C2042 | 100 | Talc D-1000 | 10 |
| | Bottom: Silicone rubber XE14-C2042 | — | None | |
| Ex. 25 | Silicone rubber TSE3033 | 100 | Wollastonite ST-40F | 10 |
| Ex. 26 | Silicone rubber TSE3033 | 100 | Wollastonite Wollasto JET30w | 10 |
| Ex. 27 | Silicone rubber TSE3033 | 100 | Mica A-11 | 20 |
| Ex. 28 | Silicone rubber TSE3033 | 100 | Zeolite SP#2300 | 20 |
| Ex. 29 | Silicone rubber TSE3033 | 100 | Sericite ST-501 | 20 |
| Ex. 30 | Silicone rubber KE-1935 | 100 | Hollow glass beads Sphericel 110P8 | 20 |

TABLE 1-2

| | Intermediate layer | | | First and second electrodes | |
|---|---|---|---|---|---|
| | Average thickness (μm) | Surface modification treatment | Variation rate of peak intensity ratio | Material | Average thickness (μm) |
| Ex. 1 | 100 | corona discharge | 0.76 | aluminium foil | 9 |
| Ex. 2 | 100 | corona discharge | 0.80 | aluminium foil | 9 |
| Ex. 3 | 100 | corona discharge | 0.91 | aluminium foil | 9 |
| Ex. 4 | 100 | corona discharge | 0.91 | aluminium foil | 9 |
| Ex. 5 | 200 | plasma | 0.81 | copper + nickel | 35 |
| Ex. 6 | 200 | plasma | 0.81 | copper + nickel | 35 |
| Ex. 7 | 200 | plasma | 0.81 | copper + nickel | 35 |
| Ex. 8 | 200 | plasma | 0.87 | copper + nickel | 35 |
| Ex. 9 | 200 | plasma | 0.88 | copper + nickel | 35 |

TABLE 1-2-continued

|  | Intermediate layer | | | First and second electrodes | |
|---|---|---|---|---|---|
|  | Average thickness (μm) | Surface modification treatment | Variation rate of peak intensity ratio | Material | Average thickness (μm) |
| Ex. 10 | 20 | plasma | 0.82 | copper + nickel | 35 |
| Ex. 11 | 300 | plasma | 0.80 | copper + nickel | 35 |
| Ex. 12 | 200 | plasma | 0.87 | copper + nickel | 35 |
| Ex. 13 | 200 | plasma | 0.84 | copper + nickel | 35 |
| Ex. 14 | 150 | plasma | 0.78 | copper + nickel | 35 |
| Ex. 15 | 150 | plasma | 0.78 | copper + nickel | 35 |
| Ex. 16 | 150 | plasma | 0.78 | copper + nickel | 35 |
| Ex. 17 | 150 | plasma | 0.73 | copper + nickel | 35 |
| Ex. 18 | 150 | plasma | 0.85 | copper + nickel | 35 |
| Ex. 19 | 20 | plasma | 0.80 | copper + nickel | 35 |
| Ex. 20 | 300 | plasma | 0.77 | copper + nickel | 35 |
| Ex. 21 | 100 100 | none | 0.95 | conductive silicone rubber | 100 |
| Ex. 22 | 100 100 | none | 0.94 | conductive silicone rubber | 100 |
| Ex. 23 | 150 | corona discharge | 0.82 | copper + nickel | 35 |
| Ex. 24 | 100 100 | corona discharge | 0.88 | conductive silicone rubber | 100 |
| Ex. 25 | 100 | electron beam irradiation | 0.78 | copper + nickel | 35 |
| Ex. 26 | 100 | electron beam irradiation | 0.78 | copper + nickel | 35 |
| Ex. 27 | 100 | plasma | 0.93 | copper + nickel | 35 |
| Ex. 28 | 100 | plasma | 0.92 | copper + nickel | 35 |
| Ex. 29 | 100 | plasma | 0.90 | copper + nickel | 35 |
| Ex. 30 | 100 | plasma | 0.90 | copper + nickel | 35 |

TABLE 1-3

|  | Spacer | | | Cover material | |
|---|---|---|---|---|---|
|  | Material | Average thickness | Intermediate layer at space side | Material | Average thickness |
| Ex. 1 |  | none | — | PET | 100 μm |
| Ex. 2 |  | none | — | PET | 100 μm |
| Ex. 3 |  | none | — | PET | 100 μm |
| Ex. 4 |  | none | — | PET | 100 μm |
| Ex. 5 |  | none | — | PVC | 80 μm |
| Ex. 6 | PET | 480 μm | larger peak ratio | PVC | 80 μm |
| Ex. 7 | PET | 480 μm | smaller peak ratio | PVC | 80 μm |
| Ex. 8 | PET | 480 μm | smaller peak ratio | PVC | 80 μm |
| Ex. 9 | PET | 480 μm | smaller peak ratio | PVC | 80 μm |
| Ex. 10 | PET | 480 μm | smaller peak ratio | PVC | 80 μm |
| Ex. 11 | PET | 480 μm | smaller peak ratio | PVC | 80 μm |
| Ex. 12 | PET | 480 μm | smaller peak ratio | PVC | 80 μm |
| Ex. 13 | PET | 480 μm | smaller peak ratio | PVC | 80 μm |
| Ex. 14 |  | none | — | PVC | 80 μm |
| Ex. 15 | PET | 480 μm | larger peak ratio | PVC | 80 μm |
| Ex. 16 | PET | 480 μm | smaller peak ratio | PVC | 80 μm |
| Ex. 17 | PET | 480 μm | smaller peak ratio | PVC | 80 μm |
| Ex. 18 | PET | 480 μm | smaller peak ratio | PVC | 80 μm |
| Ex. 19 | PET | 480 μm | smaller peak ratio | PVC | 80 μm |
| Ex. 20 | PET | 480 μm | smaller peak ratio | PVC | 80 μm |
| Ex. 21 | urethane rubber | 1 mm | smaller peak ratio | PET | 250 μm |
| Ex. 22 | urethane rubber | 1 mm | smaller peak ratio | PET | 250 μm |
| Ex. 23 | PET | 480 μm | smaller peak ratio | PVC | 80 μm |
| Ex. 24 | urethane rubber | 1 mm | smaller peak ratio | PET | 250 μm |
| Ex. 25 | PET | 480 μm | smaller peak ratio | PP | 20 μm |
| Ex. 26 | PET | 480 μm | smaller peak ratio | PP | 20 μm |
| Ex. 27 | PET | 480 μm | smaller peak ratio | PP | 20 μm |
| Ex. 28 | PET | 480 μm | smaller peak ratio | PP | 20 μm |
| Ex. 29 | PET | 480 μm | smaller peak ratio | PP | 20 μm |
| Ex. 30 | PET | 480 μm | smaller peak ratio | PP | 20 μm |

TABLE 1-4

|  | Electricity generating performance | |
|---|---|---|
|  | Voltage ratio | Rank |
| Ex. 1 | 5 | C |
| Ex. 2 | 5 | C |
| Ex. 3 | 9 | C |
| Ex. 4 | 8 | C |
| Ex. 5 | 10 | B |
| Ex. 6 | 12 | B |
| Ex. 7 | 17 | A |
| Ex. 8 | 18 | A |
| Ex. 9 | 13 | B |
| Ex. 10 | 19 | A |
| Ex. 11 | 14 | B |
| Ex. 12 | 18 | A |
| Ex. 13 | 10 | B |
| Ex. 14 | 10 | B |
| Ex. 15 | 12 | B |
| Ex. 16 | 19 | A |
| Ex. 17 | 15 | A |
| Ex. 18 | 11 | B |
| Ex. 19 | 20 | A |
| Ex. 20 | 12 | B |
| Ex. 21 | 10 | B |
| Ex. 22 | 13 | B |
| Ex. 23 | 17 | A |
| Ex. 24 | 15 | A |
| Ex. 25 | 18 | A |
| Ex. 26 | 18 | A |
| Ex. 27 | 10 | B |
| Ex. 28 | 10 | B |
| Ex. 29 | 10 | B |
| Ex. 30 | 10 | B |

TABLE 2-1

| | Intermediate layer | | | |
|---|---|---|---|---|
| | Rubber | | Filler | |
| | Type | Amount (mass parts) | Type | Amount (mass parts) |
| Ex. 31 | Silicone rubber KE-1935 | 100 | Acryl particles FH-S005 | 20 |
| Ex. 32 | Silicone rubber KE-1935 | 100 | Polystyrene particles 19520-500 | 20 |
| Ex. 33 | Top: Silicone rubber XE14-C2042 | — | None | — |
| | Bottom: Silicone rubber XE14-C2042 | 100 | Silica HS-207 | 50 |
| Ex. 34 | Top: Silicone rubber XE14-C2042 | — | None | — |
| | Bottom: Silicone rubber XE14-C2042 | 100 | Wllastonite Wollasto JET30w | 50 |
| Ex. 35 | Silicone rubber KE-1935 | 100 | Silicone resin powder Tospearl 120 | 20 |
| Ex. 36 | Silicone rubber KE-1935 | 100 | Silicone rubber powder EP-2600 | 20 |
| Ex. 37 | Silicone rubber KE-1935 | 100 | Silicone composite powder KMP-605 | 20 |
| Ex. 38 | Silicone rubber KE-1935 | 100 | Silica-acryl composite particles Soliostar RA | 10 |
| Ex. 39 | Silicone rubber KE-1935 | 100 | Silsesquioxane octamethyl substitute 526835 | 1 |
| Ex. 40 | Silicone rubber KE-1935 | 100 | Silsesquioxane octaphenyl substitute 526851 | 1 |
| Comp. Ex. 1 | Silicone rubber IVS4312 | — | None | — |
| Comp. Ex. 2 | EPDM rubber | — | None | — |
| Comp. Ex. 3 | SBR rubber | — | None | — |
| Comp. Ex. 4 | Urethane rubber | 100 | Kaolin Glomax LL | 50 |
| Comp. Ex. 5 | Piezoelectric element PVDF | — | None | — |
| Comp. Ex. 6 | Electret derivative Fluororesin CYTOP | — | None | — |

TABLE 2-2

| | Intermediate layer | | | First and second electrodes | |
|---|---|---|---|---|---|
| | Average thickness (μm) | Surface modification treatment | Variation rate of peak intensity ratio | Material | Average thickness (μm) |
| Ex. 31 | 100 μm | plasma | 0.95 | copper + nickel | 35 μm |
| Ex. 32 | 100 μm | plasma | 0.95 | copper + nickel | 35 μm |
| Ex. 33 | 50 μm | electron beam irradiation | 0.81 | first: aluminium foil second: copper foil | 20 μm 35 μm |
| | 50 μm | | | | |
| Ex. 34 | 50 μm | electron beam irradiation | 0.81 | first: aluminium foil second: copper foil | 20 μm 35 μm |
| | 50 μm | | | | |
| Ex. 35 | 100 μm | plasma | 0.83 | first: aluminium foil second: copper foil | 20 μm 35 μm |
| Ex. 36 | 100 μm | plasma | 0.83 | first: aluminium foil second: copper foil | 20 μm 35 μm |
| Ex. 37 | 100 μm | plasma | 0.82 | first: aluminium foil second: copper foil | 20 μm 35 μm |
| Ex. 38 | 100 μm | electron beam irradiation | 0.75 | first: aluminium foil second: copper foil | 20 μm 35 μm |
| Ex. 39 | 100 μm | electron beam irradiation | 0.72 | first: aluminium foil second: copper foil | 20 μm 35 μm |
| Ex. 40 | 100 μm | electron beam irradiation | 0.72 | first: aluminium foil second: copper foil | 20 μm 35 μm |
| Comp. Ex. 1 | 100 μm | none | 0.99 | aluminium foil | 9 μm |
| Comp. Ex. 2 | 200 μm | corona discharge | — | aluminium foil | 9 μm |
| Comp. Ex. 3 | 200 μm | corona discharge | — | aluminium foil | 9 μm |
| Comp. Ex. 4 | 100 μm | corona discharge | — | aluminium foil | 9 μm |
| Comp. Ex. 5 | 110 μm | none | — | silver | 6 μm |
| Comp. Ex. 6 | 10 μm | none | — | first: copper foil second: copper plate | 35 μm 100 μm |

TABLE 2-3

| | Spacer | | | Cover material | |
|---|---|---|---|---|---|
| | Material | Average thickness | Intermediate layer at space side | Material | Average thickness |
| Ex. 31 | PET | 480 μm | smaller peak ratio | PP | 20 μm |
| Ex. 32 | PET | 480 μm | smaller peak ratio | PP | 20 μm |
| Ex. 33 | PET | 480 μm | smaller peak ratio | top: PET<br>bottom: PET | 100 μm<br>50 μm |
| Ex. 34 | PET | 480 μm | smaller peak ratio | top: PET<br>bottom: PET | 100 μm<br>50 μm |
| Ex. 35 | PET | 480 μm | smaller peak ratio | top: PET<br>bottom: PET | 100 μm<br>50 μm |
| Ex. 36 | PET | 480 μm | smaller peak ratio | top: PET<br>bottom: PET | 100 μm<br>50 μm |
| Ex. 37 | PET | 480 μm | smaller peak ratio | top: PET<br>bottom: PET | 100 μm<br>50 μm |
| Ex. 38 | PET | 480 μm | smaller peak ratio | top: PET<br>bottom: PET | 100 μm<br>50 μm |
| Ex. 39 | PET | 480 μm | smaller peak ratio | top: PET<br>bottom: PET | 100 μm<br>50 μm |
| Ex. 40 | PET | 480 μm | smaller peak ratio | top: PET<br>bottom: PET | 100 μm<br>50 μm |
| Comp. Ex. 1 | none | — | — | PET | 100 μm |
| Comp. Ex. 2 | none | — | — | PET | 100 μm |
| Comp. Ex. 3 | none | — | — | PET | 100 μm |
| Comp. Ex. 4 | none | — | — | PET | 100 μm |
| Comp. Ex. 5 | none | — | — | PET | 100 μm |
| Comp. Ex. 6 | none | — | — | top: PET<br>bottom: PET | 50 μm<br>100 μm |

TABLE 2-4

| | Electricity generating performance | |
|---|---|---|
| | Voltage ratio | Rank |
| Ex. 31 | 5 | C |
| Ex. 32 | 5 | C |
| Ex. 33 | 15 | A |
| Ex. 34 | 15 | A |
| Ex. 35 | 16 | A |
| Ex. 36 | 17 | A |
| Ex. 37 | 17 | A |
| Ex. 38 | 12 | B |
| Ex. 39 | 15 | A |
| Ex. 40 | 15 | A |
| Comp. Ex. 1 | 1 | Standard |
| Comp. Ex. 2 | 0.8 | F |
| Comp. Ex. 3 | 0.4 | F |
| Comp. Ex. 4 | 0.8 | F |
| Comp. Ex. 5 | 1 | E |
| Comp. Ex. 6 | 2 | D |

TABLE 3-1

| | Intermediate layer | | | |
|---|---|---|---|---|
| | Rubber | | Filler | |
| | Type | Amount (mass parts) | Type | Amount (mass parts) |
| Ex. 41 | Silicone rubber TSE3033 | 100 | Silica Sylysia 430<br>Barium titanate | 20<br>10 |
| Ex. 42 | Silicone rubber TSE3033 | 100 | Silica Sylysia 430<br>Titanium oxide | 20<br>5 |
| Ex. 43 | Silicone rubber TSE3033 | 100 | Silica Sylysia 430<br>Iron oxide | 20<br>5 |
| Ex. 44 | Silicone rubber TSE3033 | 100 | Kaolin Glomax LL<br>Carbon nanofiber | 10<br>0.1 |
| Ex. 45 | Silicone rubber TSE3033 | 100 | Kaolin Glomax LL<br>Fullerene | 10<br>0.1 |
| Ex. 46 | Silicone rubber TSE3033 | 100 | Silica Sylysia 430<br>Silicone rubber powder EP-2600 | 20<br>10 |
| Ex. 47 | Silicone rubber TSE3033 | 100 | Kaolin Glomax LL<br>Silsesquioxane Octamethyl substitute | 10<br>1 |
| Ex. 48 | Silicone rubber IVS4312 | 100 | Silica Sylysia 430 | 5 |
| Ex. 49 | Silicone rubber IVS4312 | 100 | Silica Sylysia 430 | 0.5 |

TABLE 3-2

| | Intermediate layer | | | First and second electrode | |
|---|---|---|---|---|---|
| | Average thickness (μm) | Surface modification treatment | Variation rate of peak intensity ratio | Material | Average thickness (μm) |
| Ex. 41 | 50 | plasma | 0.84 | conductive silicone rubber | 100 |
| Ex. 42 | 50 | plasma | 0.82 | conductive silicone rubber | 100 |
| Ex. 43 | 50 | plasma | 0.82 | conductive silicone rubber | 100 |
| Ex. 44 | 50 | plasma | 0.80 | conductive silicone rubber | 100 |
| Ex. 45 | 50 | plasma | 0.80 | conductive silicone rubber | 100 |
| Ex. 46 | 50 | plasma | 0.82 | conductive silicone rubber | 100 |
| Ex. 47 | 50 | plasma | 0.81 | conductive silicone rubber | 100 |
| Ex. 48 | 100 | UV ray irradiation | 0.93 | aluminium foil | 9 |
| Ex. 49 | 100 | none | 0.98 | aluminium foil | 9 |

TABLE 3-3

| | Spacer | | | Cover material | |
|---|---|---|---|---|---|
| | Material | Average thickness | Intermediate layer at space side | Material | Average thickness |
| Ex. 41 | urethane rubber | 1 mm | smaller peak ratio | PET | 250 μm |
| Ex. 42 | urethane rubber | 1 mm | smaller peak ratio | PET | 250 μm |
| Ex. 43 | urethane rubber | 1 mm | smaller peak ratio | PET | 250 μm |
| Ex. 44 | urethane rubber | 1 mm | smaller peak ratio | PET | 250 μm |
| Ex. 45 | urethane rubber | 1 mm | smaller peak ratio | PET | 250 μm |
| Ex. 46 | urethane rubber | 1 mm | smaller peak ratio | PET | 250 μm |
| Ex. 47 | urethane rubber | 1 mm | smaller peak ratio | PET | 250 μm |
| Ex. 48 | none | — | — | PET | 100 μm |
| Ex. 49 | none | — | — | PET | 100 μm |

TABLE 3-4

| | Electricity generating performance | |
|---|---|---|
| | Voltage ratio | Rank |
| Ex. 41 | 23 | A |
| Ex. 42 | 21 | A |
| Ex. 43 | 23 | A |
| Ex. 44 | 22 | A |
| Ex. 45 | 23 | A |
| Ex. 46 | 26 | A |
| Ex. 47 | 25 | A |
| Ex. 48 | 10 | B |
| Ex. 49 | 4 | D |

It was found from the results of Tables 1-1 to 1-4, Tables 2-1 to 2-4, and Tables 3-1 to 3-4 that all of Examples 1 to 49 had high electricity generation performances compared to Comparative Examples 1 to 6.

In Examples 1 to 48, the intermediate layer was composed of the silicone rubber composition containing silicone rubber, and had a structure where the peak intensity ratio ($1095\pm5$ cm$^{-1}$/$1025\pm5$ cm$^{-1}$) of the infrared absorption spectrum of the intermediate layer varies along the vertical direction relative to a surface of the first electrode, and to a surface of the second electrode. Accordingly, it was found that the electricity generation performances of Examples 1 to 48 was higher than the electricity generation performances of Comparative Examples 1 to 6.

Since the filler was contained in the intermediate layer in Examples 3 to 48, moreover, it was found that the electricity generation performances were improved compared to the electricity generation performances of Examples 1 to 2 (no filler was added).

Since the filler is a silicone atom-containing compound in Examples 5 to 30 and 33 to 48, the electricity generation performances were improved compared to the electricity generation performances of Examples 3, 4, 31, 32 (the filler was a compound that did not contain silicon atoms). Moreover, it was found that the electricity generation performance was particularly improved, when the silicon atom-containing compound was silica, kaolin, talc, wollastonite, silicone powder, or silsesquioxane.

It was found from the comparison between Examples 5 to 7 with Examples 14 to 16 that the structure having a space between the intermediate layer and the electrode improved the electricity generation performance better than the structure having no space. Moreover, it was found that the structure where the space was disposed at the side of the surface of the intermediate layer having the smaller peak intensity ratio ($1095\pm5$ cm$^{-1}$/$1025\pm5$ cm$^{-1}$) of the infrared absorption spectrum improved the electricity generation performance better than the structure where the space was disposed at the side of the surface of the intermediate layer having the larger peak intensity ratio.

Example 50

<Evaluation of Inverse Piezoelectric Effect>

The element of Example 1 was connected to a function generator (FG-274, manufactured by TEXIO TECHNOLOGY CORPORATION) in the manner that electrodes facing to each other had mutually different polarities. Voltage was applied to the element under the following conditions, and audibility of sound from the location apart from the element by 1 μm was judged. The sound of the element of Example 1 was audible with all the frequencies.

<Voltage Application Conditions>
CMOS output: ±5 V
Output waveform: square wave (Duty ratio: 50%)
Frequency: 3 levels, 400 Hz, 2 kHz, and 12 kHz Comparative Example 7

<Evaluation of Inverse Piezoelectric Effect>
The element of Comparative Example 1 was subjected to an evaluation of the inverse piezoelectric effect in the same manner as in Example 50. The sound of the element of Comparative Example 1 could not be heard at any of the frequencies.

It was confirmed from the results of Example 50 and Comparative Example 7 that the element of the present invention vibrated as the voltage was applied, specifically, exhibiting an inverse piezoelectric effect.

For example, the embodiments of the present invention are as follows.
<1> An element including:
a first electrode;
an intermediate layer made of a silicone rubber composition containing a silicone rubber; and
a second electrode, where the first electrode, the intermediate layer, and the second electrode are disposed in this order,
wherein a peak intensity ratio ($1095\pm5$ cm$^{-1}$/$1025\pm5$ cm$^{-1}$) of an infrared absorption spectrum of the intermediate layer varies along a vertical direction relative to a surface of the first electrode, and to a surface of the second electrode.
<2> The element according to <1>, wherein a variation rate of the peak intensity ratio is 0.95 or less, where the variation rate is a value obtained from:
a peak intensity ratio ($1095\pm5$ cm$^{-1}$/$1025\pm5$ cm$^{-1}$) of an infrared absorption spectrum of the intermediate layer measured at a position that is 1 μm in depth from a surface of the intermediate layer at a side of the first electrode; and
a peak intensity ratio ($1095\pm5$ cm$^{-1}$/$1025\pm5$ cm$^{-1}$) of an infrared absorption spectrum of the intermediate layer measured at a position that is 1 μm in depth from a surface of the intermediate layer at a side of the second electrode,
by dividing the peak intensity ratio that is smaller by the peak intensity ratio that is larger.
<3> The element according to <1> or <2>, wherein the silicone rubber composition contains filler.
<4> The element according to <3>, wherein the filler contains a silicon atom-containing compound.
<5> The element according to <4>, wherein the silicon atom-containing compound contains at least one selected from the group consisting of silica, kaolin, talc, wollastonite, silicone powder, and silsesquioxane.
<6> The element according to any one of <1> to <5>, wherein a space is provided at at least one position of a position between the intermediate layer and the first electrode, and a position between the intermediate layer and the second electrode.
<7> The element according to <6>, wherein the surface of the intermediate layer, at which the peak intensity ratio ($1095\pm5$ cm$^{-1}$/$1025\pm5$ cm$^{-1}$) of the infrared absorption spectrum of the intermediate layer is smaller, faces the space.
<8> The element according to any one of <1> to <7>, wherein the intermediate layer has been subjected to a surface modification treatment.
<9> The element according to <8>, wherein the surface modification treatment is a plasma treatment, a corona discharge treatment, or an electron-beam irradiation treatment.
<10> An electric generator including:
the element according to any one of <1> to <9>.

The element according to any one of <1> to <9> and the electric generator according to <10> can solve the aforementioned various problems in the art, and achieve the aforementioned object of the present invention.

REFERENCE SIGNS LIST 1 element
2 first electrode
3 second electrode
4 intermediate layer (whole)
5 spacer
6 space
7 silicone rubber
8 filler
9 intermediate layer (a region where a peak intensity ratio is small)
10 intermediate layer (a region where a peak intensity ratio is large)
11 electric generator
12 cover material
13 electrical wire
14 electric circuit

The invention claimed is:
1. An element comprising:
a first electrode;
an intermediate layer made of a silicone rubber composition containing a silicone rubber; and
a second electrode, wherein the first electrode, the intermediate layer, and the second electrode are disposed in this order,
wherein the intermediate layer has peak intensities of an infrared absorption spectrum at $1095\pm5$ cm$^{-1}$ and $1025\pm5$ cm$^{-1}$ and the peak intensities are higher toward a depth direction of the intermediate layer, the infrared absorption spectrum being based on a Si—O—Si bond of the silicone rubber composition.

2. The element according to claim 1, wherein a peak intensity ratio ($1095\pm5$ cm$^{-1}$/$1025\pm5$ cm$^{-1}$) of the infrared absorption spectrum of the intermediate layer varies along the depth direction from a surface of the intermediate layer at a side of the first electrode.

3. The element according to claim 2, wherein a variation rate of the peak intensity ratio is 0.95 or less, wherein the variation rate is a value obtained from:
a peak intensity ratio ($1095\pm5$ cm$^{-1}$/$1025\pm5$ cm$^{-1}$) of an infrared absorption spectrum of the intermediate layer measured at a position that is 1 μm in depth from a surface of the intermediate layer at a side of the first electrode; and
a peak intensity ratio ($1095\pm5$ cm$^{-1}$/$1025\pm5$ cm$^{-1}$) of an infrared absorption spectrum of the intermediate layer measured at a position that is 1 μm in depth from a surface of the intermediate layer at a side of the second electrode,
by dividing the peak intensity ratio that is smaller by the peak intensity ratio that is larger.

4. The element according to claim 1, wherein the silicone rubber composition comprises filler.

5. The element according to claim 4, wherein the filler comprises a silicon atom-containing compound.

6. The element according to claim 5, wherein the silicon atom-containing compound comprises at least one selected from the group consisting of silica, kaolin, talc, wollastonite, silicone powder, and silsesquioxane.

7. The element according to claim 1, wherein a space is provided at at least one position of: a position between the intermediate layer and the first electrode, or a position between the intermediate layer and the second electrode.

8. The element according to claim 7, wherein the surface of the intermediate layer, at which the peak intensity ratio ($1095\pm5$ cm$^{-1}$/$1025\pm5$ cm$^{-1}$) of the infrared absorption spectrum of the intermediate layer is smaller, faces the space.

9. The element according to claim 1, wherein the intermediate layer has been subjected to a surface modification treatment.

10. The element according to claim 9, wherein the surface modification treatment is a plasma treatment, a corona discharge treatment, or an electron-beam irradiation treatment.

11. An electric generator comprising:

an element, wherein the element includes:

a first electrode;

an intermediate layer made of a silicone rubber composition containing a silicone rubber; and a second electrode, wherein the first electrode, the intermediate layer, and the second electrode are disposed in this order, and wherein the intermediate layer has peak intensities of an infrared absorption spectrum at $1095\pm5$ cm$^{-1}$ and $1025\pm5$ cm$^{-1}$ and the peak intensities are higher toward a depth direction of the intermediate layer, the infrared absorption spectrum being based on a Si—O—Si bond of the silicone rubber composition.

* * * * *

UNITED STATES PATENT AND TRADEMARK OFFICE
CERTIFICATE OF CORRECTION

PATENT NO. : 10,636,958 B2
APPLICATION NO. : 15/545136
DATED : April 28, 2020
INVENTOR(S) : Yuko Arizumi et al.

Page 1 of 1

It is certified that error appears in the above-identified patent and that said Letters Patent is hereby corrected as shown below:

On the Title Page

Item (30), the Foreign Application Priority Data information is incorrect. Item (30) should read:
--(30) Foreign Application Priority Data
Jan. 22, 2015     (JP)..................... 2015-010283
Sep. 25, 2015    (JP)..................... 2015-188895--

Signed and Sealed this
Thirtieth Day of June, 2020

Andrei Iancu
*Director of the United States Patent and Trademark Office*